United States Patent [19]

Carlson

[11] Patent Number: 4,862,249
[45] Date of Patent: Aug. 29, 1989

[54] PACKAGING SYSTEM FOR STACKING INTEGRATED CIRCUITS

[75] Inventor: Randolph S. Carlson, Carson City, Nev.

[73] Assignee: XOC Devices, Inc.

[21] Appl. No.: 39,632

[22] Filed: Apr. 17, 1987

[51] Int. Cl.[4] .................. H01L 23/12; H01L 23/04; H01L 23/14

[52] U.S. Cl. ...................... 357/80; 357/75; 357/74

[58] Field of Search .............. 357/80, 75, 74, 70, 357/68, 56, 72; 174/52 FP

[56] References Cited

U.S. PATENT DOCUMENTS

| | | | |
|---|---|---|---|
| 3,988,196 | 10/1976 | Wanesky | 156/541 |
| 3,992,236 | 11/1976 | Wanesky | 156/83 |
| 3,999,105 | 12/1976 | Archey et al. | |
| 4,023,997 | 5/1977 | Wanesky | 156/631 |
| 4,218,701 | 8/1980 | Shirasaki | 357/70 |
| 4,288,841 | 9/1981 | Gogal | 357/75 |
| 4,330,790 | 5/1982 | Burns | 357/70 |
| 4,394,712 | 7/1983 | Anthony | 361/411 |
| 4,398,235 | 8/1983 | Lutz et al. | 361/393 |
| 4,437,109 | 3/1984 | Anthony et al. | 357/68 |
| 4,457,976 | 7/1984 | Faith, Jr. et al. | 428/457 |
| 4,499,655 | 2/1985 | Anthony | 357/68 |
| 4,500,905 | 2/1985 | Shibata | 357/56 |
| 4,525,921 | 7/1985 | Carson et al. | 250/578 |
| 4,547,795 | 10/1985 | Wulff | 357/80 |
| 4,551,629 | 11/1985 | Carson et al. | 29/577 |
| 4,554,575 | 11/1985 | Lucas | 357/80 |
| 4,600,611 | 7/1986 | Clark | 357/70 |
| 4,613,891 | 9/1986 | Ng et al. | 357/68 |
| 4,618,763 | 10/1986 | Schmitz | 250/211 |
| 4,622,433 | 11/1986 | Frampton | 174/52 FP |
| 4,631,573 | 12/1986 | Sutrina | 357/82 |
| 4,661,837 | 4/1987 | Sono | 357/72 |
| 4,672,418 | 6/1987 | Moran et al. | 357/74 |
| 4,698,663 | 10/1987 | Sugimoto et al. | 357/80 |

FOREIGN PATENT DOCUMENTS

| | | | |
|---|---|---|---|
| 58-219757 | 12/1983 | Japan | 357/75 |
| 61154 | 4/1984 | Japan | 357/70 |
| 60-165748 | 8/1985 | Japan | 357/70 |
| 254762 | 12/1985 | Japan | 357/75 |
| 61-63048 | 4/1986 | Japan | 357/75 |
| 61-75558 | 4/1986 | Japan | 357/75 |

OTHER PUBLICATIONS

"Thermal Stress Resistant Solder Reflow Chip Joints'-'-Hamilton et al.-IBM Technical Disclosure Bulletin-vol. 14, No. 1, Jun. 1971, pp. 257-258.

Primary Examiner—Andrew J. James
Assistant Examiner—Sheila V. Clark

[57] ABSTRACT

Integrated circuit dies are mounted to the interconnection leads on frames of tape automatic bonding (TAB) film. Thereafter, each frame of the TAB film with the attached integrated circuit die is affixed to an electrically insulating, thermally conductive plate to form a sandwich structure. A number of sandwich structures are bonded together to form a stack of the sandwiches. The interconnection leads of each sandwich in the stack are selectively electrically connected to the interconnection leads of other sandwiches in the stack to form a system of electrically interconnected integrated circuits. The system is compact and has short interconnection paths between integrated circuits so that the propagation delays of signals between integrated circuits are minimized.

29 Claims, 7 Drawing Sheets

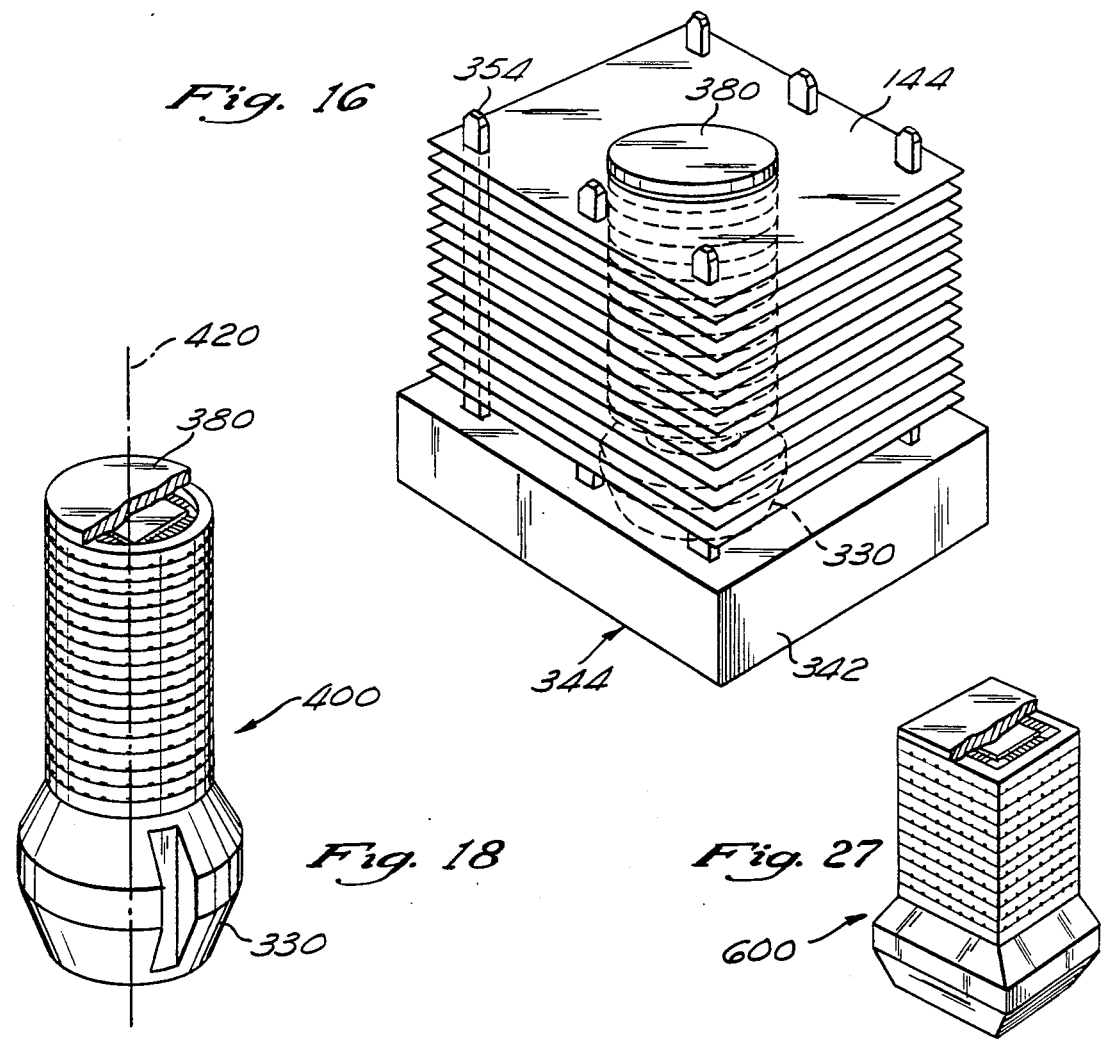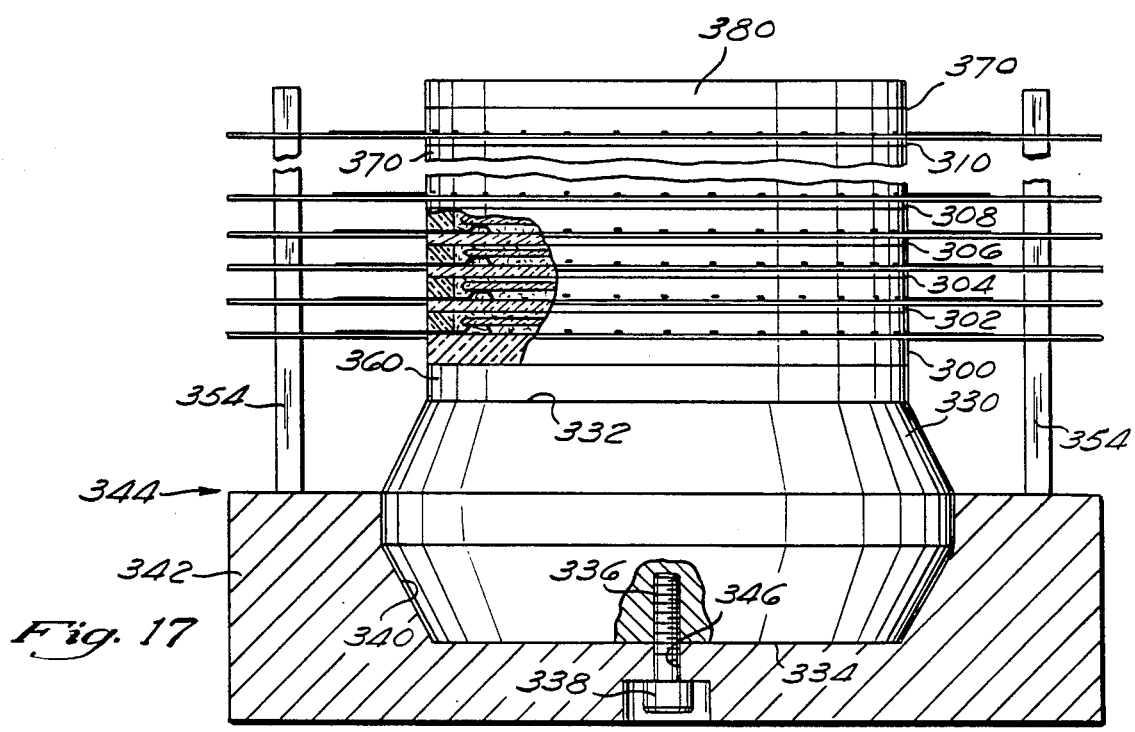

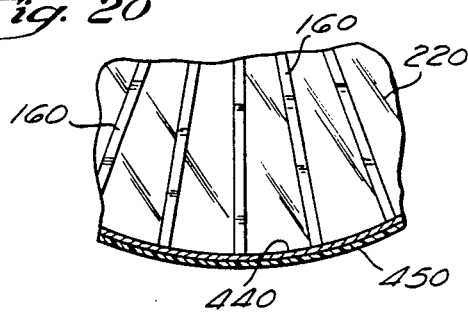
Fig. 20
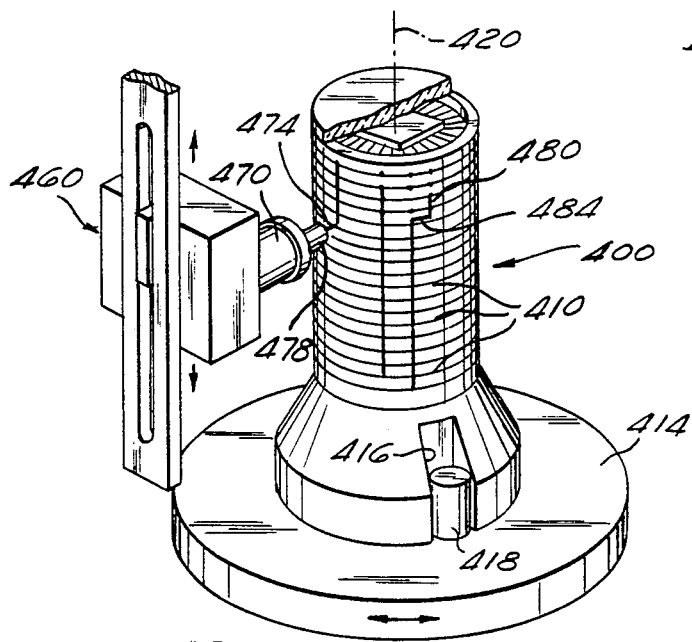
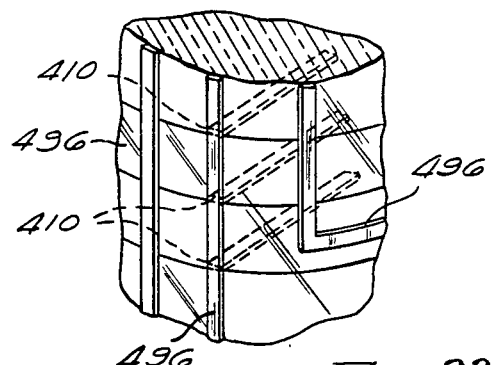
Fig. 22
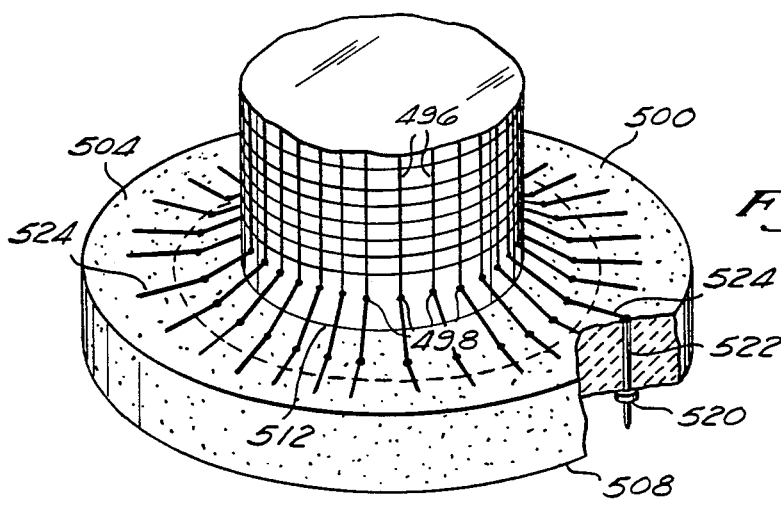
Fig. 21
Fig. 19
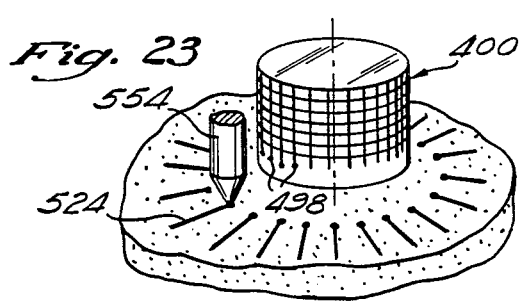
Fig. 23
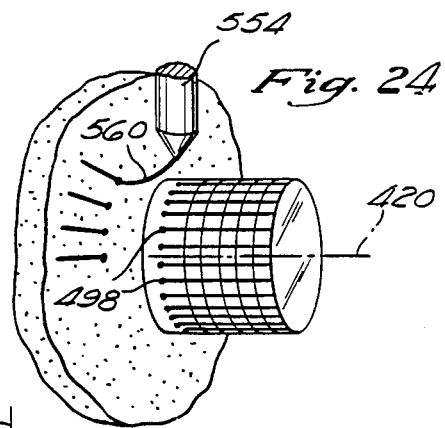
Fig. 24
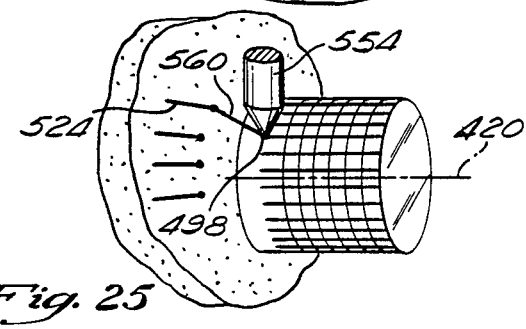
Fig. 25
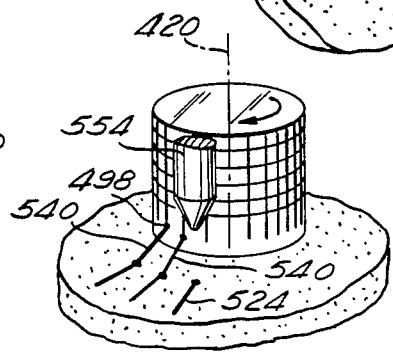
Fig. 26

PACKAGING SYSTEM FOR STACKING INTEGRATED CIRCUITS

BACKGROUND OF THE INVENTION

1. Field of the Invention

The present invention is related to integrated circuits, and, in particular, is related to the packaging of integrated circuits so that a large quantity of integrated circuits can be physically located on the surface of a printed circuit board, or the like.

2. Description of the Related Art

The continuing advances in electronics technology, and in particular the technology related to integrated circuits, provide a steady improvement in the cost and performance of electronic circuits, particularly in the digital electronics and computer related fields. The complexity of integrated circuits has increased substantially in the years since such circuits were first developed and it is not unusual for a single integrated circuit to include all the circuit elements previously provided by a relatively large number of integrated circuits only a few years ago. Furthermore, the operational speeds of integrated circuits are also being improved both by using different technologies and by using smaller gates and shorter interconnections between gates to reduce propagation times.

Notwithstanding the increases in complexities and speeds of the integrated circuits, there continues to be a need to interconnect a large number of integrated circuits together to provide a complete system. For example, an exemplary computer system includes one or more processing elements (e.g., microprocessors), a plurality of memory circuits, device controller circuits, and input and output buffer circuits. These circuits are typically packaged in carriers, such as dual-in-line packages, flat packages, ceramic chip carriers, or the like. The carriers are typically interconnected on a printed circuit board, or the like. Although the speeds and circuit densities of the integrated circuits have increased substantially, much of the improvement is given up when conventional circuit packages on conventional planar circuit boards are used. The space required for the package material and the space required for the interconnection wiring between the integrated circuit carriers occupies a substantial portion of the board space. In addition, delays in the propagation of signals through the lengths of the interconnection wiring can be a significant portion of the signal propagation time. Thus, there are many disadvantages to the conventional combination of integrated circuit packages and printed circuit boards.

The foregoing problems have been recognized in some applications and attempts have been made to increase the packing density of integrated circuit elements. For example, there are hybrid circuit packages that include at least two integrated circuits in the same chip carrier. This technique continues to utilize the concept of mounting the integrated circuit dies in the same plane.

Other techniques have been developed wherein the integrated circuits are stacked vertically (i.e., normal to the plane of the active surfaces of the integrated circuit dies). For example, U.S. Pat. No. 4,398,235 illustrates the vertical stacking of dual-in-line packages. U.S. Pat. No. 4,288,891 illustrates a system of two integrated circuit dies in a double-cavity chip carrier that requires an interposed interconnection layer between the dies. U.S. Pat. No. 4,525,921 illustrates a system for packaging integrated circuit dies in the same package wherein the die is modified by etching a portion of the die to expose a portion of the metallization layer of the die. U.S. Pat. No. 3,999,105 illustrates a package for stacking semiconductor wafers.

A need continues to exist for a system of packaging a plurality of integrated circuits in a single package to achieve high packing density and using a minimum of printed circuit board space.

SUMMARY OF THE INVENTION

One aspect of the present invention is an apparatus for interconnecting a plurality of integrated circuits. The apparatus includes a plurality of stacked sandwiched structures. Each of the sandwiched structures includes an integrated circuit die that has a plurality of bonding pads on one surface. The surface has an outer periphery. Each of the sandwiched structures further includes a first plurality of electrical conductors that are electrically and mechanically bonded to the bonding pads of the integrated circuit die. In addition, the sandwiched structure includes a first electrically insulating plate that is adhesively bonded to the integrated circuit die. The insulating plate is advantageously thermally conductive, and, in preferred embodiments is sapphire. The first electrical insulating plate has an outer periphery with dimensions selected so that the outer periphery of the first electrically insulating plate extends beyond the outer periphery of the surface of the integrated circuit, and so that an exposed portion of each of the first plurality of electrical conductors extends beyond the outer periphery of the first electrically insulating plate. The apparatus further includes a second plurality of electrical conductors that electrically interconnect the exposed portions of the first plurality of electrical conductors of one of the stacked sandwiched structures with the exposed portions of the first plurality of electrical conductors of others of the stacked sandwiched structures.

In preferred embodiments of the apparatus the first electrically insulating plate is circular.

Also in preferred embodiments of the apparatus, at least one of the sandwiches further includes a second electrically insulating plate having a centrally disposed cavity therein. The second electrically insulating plate is positioned on the first plurality of electrical conductors so that the first plurality of electrical conductors are positioned between the second electrically insulating plate and the first electrically insulating plate. Preferably, the integrated circuit die is positioned within the centrally disposed cavity of the second electrically insulating plate. Also preferably, the second electrically insulating plate is thermally conductive, and, in preferred embodiments, comprises sapphire.

In certain embodiments of the present invention, the first and second electrically insulating plates are circular.

Preferably, the first plurality of electrical conductors of each of the sandwiched structures are formed as a pattern on a frame of tape automatic bonding (TAB) film. Each frame of the TAB film includes a plurality of sprocket holes that are used to align the plurality of sandwiched structures when the sandwiched structures are being stacked.

In preferred embodiments of the invention, the plurality of stacked sandwiched structures are bonded together with an adhesive, the sprocket holes serving to align the sandwiched structures until the adhesive is cured.

In preferred embodiments of the apparatus, the second plurality of electrical conductors that interconnect the exposed portions of the first plurality of electrical conductors of the sandwiched structures comprise a layer of metal that has portions of the metal removed to form the second plurality of electrical conductors.

Another aspect of the present invention is an apparatus for packaging integrated circuits. The apparatus includes an integrated circuit die that has a plurality of bonding bonds on a first die surface. The apparatus also includes a plurality of electrical conductors that are electrically bonded to the bonding pads of the integrated circuit die. A plate of thermally conductive, electrically insulating material, for example, sapphire, that has a first plate surface and a second plate surface, each having an outer periphery. The first plate surface is positioned proximate to the first die surface so that the plurality of electrical conductors are disposed between the first die surface and the first plate surface, with at least a portion of each of the electrical conductors exposed at the outer peripheries of the first and second plate surfaces. Preferably, the first plate surface is bonded to the first die surface.

In certain embodiments of this aspect of the invention, the first plate surface has a raised central portion and an outer peripheral portion. The raised central portion is bonded to the first die surface with the outer peripheral portion proximate to but spaced apart from the plurality of electrical conductors.

In alternative embodiments of this aspect of the invention, the integrated circuit die has a second die surface that is opposite the first die surface, and the second die surface is positioned to be substantially parallel to the second plate surface. The second die surface is advantageously positioned to be substantially parallel to the second plate surface by grinding the second die surface.

In further alternative embodiments of this aspect of the invention, a second thermally conductive, electrically insulating plate is included, which may advantageously be sapphire. The second plate has a cavity formed in it. The second plate is positioned proximate to the first plate so that the plurality of electrical conductors is clamped between the first plate and the second plate and so that the integrated circuit die is positioned within the cavity of the second plate.

In certain preferred embodiments of the invention, the first and second plates are both circular. Preferably, the second plate has first and second substantially parallel surfaces, and the first surface of the second plate is positioned in juxtaposition with the first surface of th first plate with the plurality of conductors therebetween. The second surface of the second plate positioned to be substantially parallel to the second surface of the first plate.

In particularly preferred embodiments of this aspect of th invention, the plurality of electrical conductors are mounted in a frame of tape automatic bonding (TAB) film. The frame of TAB film has a plurality of sprocket holes that provide alignment of the conductors with the bonding pads on the first die surface.

Another aspect of the present invention is a method of packaging integrated circuits. The method includes the steps of bonding a plurality electrical conductors to a plurality of bonding pads on a first surface of an integrated circuit die, and mounting a first plate of thermally conductive, electrically insulating material, having first and second plate surfaces, to the integrated circuit die so that the first plate surface is proximate to the first die surface and so that the plurality of electrical conductors are disposed between the first die surface with a portion of each of the plurality of electrical conductors exposed at the periphery of th plate. The method preferably includes the step of positioning a second plate of thermally conductive, electrically insulating material proximate to the first plate and the plurality of electrical conductors so that the plurality of electrical conductors are clamped between the first plate and the second plate. The second plate has first and second plate surfaces, and has a cavity formed in the first surface. The integrated circuit die is preferably positioned within the cavity.

The positioning step preferably includes the step of aligning the second surface of the second plate so that it is parallel with the second surface of the first plate.

Another aspect of the present invention is a method of manufacturing a system of integrated circuits. The method includes the step of forming a plurality of integrated circuit sandwiches. The forming step for each of the integrated circuit sandwiches includes the steps of bonding a plurality electrical conductors to a plurality of bonding pads on a first surface of an integrated circuit die, and mounting a first plate of thermally conductive, electrically insulating material, such as sapphire, to the integrated circuit die. The first plate has first and second plate surfaces, and is mounted to the die so that the first plate surface is proximate to the first die surface and so that the plurality of electrical conductors are disposed between the first die surface. A portion of each of the plurality of electrical conductors is exposed at the periphery of the first plate. The method further includes the step of aligning the plurality of integrated circuit sandwiches so that the exposed portions of the plurality of electrical conductors of each sandwich are aligned. The method also includes the step of interconnecting the exposed portions of the plurality of electrical conductors.

Preferably, the plurality of electrical conductors in each sandwich includes metallized conductive paths on a frame of tape automatic bonding (TAB) film. The frame of TAB film has plurality of sprocket holes positioned in a known, fixed location with respect to the plurality of electrical conductors. The step of aligning the plurality of integrated circuits includes the step of aligning the sprocket holes of each of the plurality of sandwiches so that the plurality of electrical conductors of each sandwich are aligned with the plurality of electrical conductors of adjacently stacked sandwiches.

Also preferably, the step of interconnecting the exposed portions of the plurality of electrical conductors includes the step of removing portions of the exposed portions of the plurality of electrical conductors that extend beyond the peripheries of the first plates of the sandwiches so that the exposed portions of the electrical conductors are substantially flush with the peripheries of the first plate of each sandwich. The method preferably includes the steps of applying a layer of electrically conductive metal to the peripheries of the first plates of the sandwiches in contact with the exposed portions of the electrical conductors, and then removing selected portions of the layer of electrically conductive metal to provide a plurality of electrically conductive paths defined by the metal remaining after the removing step.

Brief Description of the Drawings

FIG. 7b is an enlarged cross-sectional view of a portion of the integrated circuit die/ TAB film/ insulating plate sandwich of FIG. 7a as defined by the dashed lines 7b in FIG. 7a.

FIG. 16 is a perspective view of one embodiment of a system of integrated circuit die/ TAB film/ insulating plate/ clamping ring sandwiches built in accordance with the present invention showing an alignment fixture used to precisely align the plural sandwiches until the bonding material has cured.

FIG. 17 is an elevation view of the system of FIG. 17 showing additional details of the construction of the system in partial cross-sectional views.

FIG. 18 is a perspective view of the system of FIGS. 16 and 17 showing the completed assembly of the plurality of sandwiches with the excess TAB film removed to the boundaries of the circular flat plates and clamping rings of each sandwich to form a cylinder of the sandwiches.

FIG. 19 is a perspective view of the sandwich cylinder of FIG. 18 to which a metallic layer and a layer of light-sensitive etchant-resistant material has been added, and showing a controlled light source for exposing the etchant-resistant material to form an interconnection pattern thereon.

FIG. 20 is a partial cross-sectional view of the system of FIG. 19 taken along the lines 20—20 in FIG. 19, showing additional details of the metallic layer and the etchant-resistant material prior to etching.

FIG. 21 is a perspective view of the system of FIGS. 18-20 showing an exemplary pattern of electrically conductive leads interconnecting the exposed ends of the TAB film conductors, and also showing a ceramic base plate for supporting the sandwich cylinder.

FIG. 22 is a partial enlarged view of the system of FIG. 21 showing additional details of the etched metallic conductors that interconnect the exposed ends of the TAB film conductors on the perimeter of the sandwich cylinder.

FIGS. 23-26 are partial perspective views of the present invention illustrating the steps of interconnecting the conductors on the sandwich cylinder with the conductors on the ceramic base plate.

FIG. 27 illustrates an alternative embodiment of the present invention comprising a stack of rectangular sandwiches having four flat faces.

Detailed Description of the Preferred Embodiment

Figure 1:
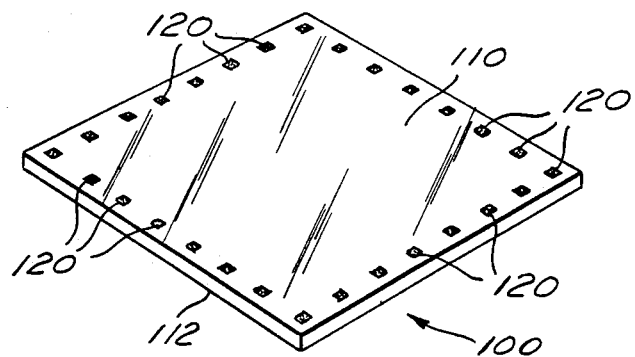
FIG. 1 is a perspective view of an exemplary integrated circuit die.

FIG. 1 illustrates an exemplary integrated circuit die 100, sometimes referred to as an integrated circuit "chip." A typical die 100 is formed during an integrated circuit manufacturing process in which a large number of integrated circuit dies are formed on a wafer of silicon, or other material. Thereafter, the wafer is scribed and cut (or broken) to provide a number of individual dies, such as the die 100, each of which typically has rectangular dimensions. The die 100 has a top planar surface 110 and has a bottom planar surface 112 that is generally parallel to the top planar surface 100. The integrated circuit die 100 has multiple layers of material that form the active components of the circuitry of the die 100. Typically, the top planar surface 110 is a metallization surface that provides the final interconnections between the active portions of the integrated circuit. (As used herein, the "top surface" of the integrated circuit die 100 refers to the metallization surface 110 and the "bottom surface" refers to the opposite parallel surface 112, irrespective of a particular orientation of the integrated circuit die.) At least a portion of the final interconnections connect the active portions of the integrated circuit to a plurality of bonding pads 120. The bonding pads 120 provide a relatively large area of metallization to which external conductors can be connected by ultrasonic welding, compression bonding, or other conventional means, to provide for connection of electrical conductors to the die 100, so that electrical signals and power can be communicated to and from the die 100. The number of bonding pads 120 depends upon the electrical configuration of the circuitry of the die 100, and, typically, a substantial amount of design effort is expended in order to reduce the number of bonding pads 120 required for the circuitry. Thus, although the integrated circuit die 100 is shown with 28 bonding pads 120, one will understand that many integrated circuits have considerably more bonding pads (for example, in excess of 200). Although shown as a single row of bonding pads 120 around the periphery of the integrated circuit die 100, it should be understood that integrated circuits having a large number of bonding pads 120 often have multiple rows of bonding pads 120.

The sizes of integrated circuit dies vary in accordance with the amount of circuitry that the die has and in accordance with the process that produces the integrated circuit. For example, the top surface 110 can be less than 0.1 inch on each side for a small scale integrated circuit, and can be greater than 0.4 inch on each side for a very large scale integrated (VLSI) circuit.

Figure 2:
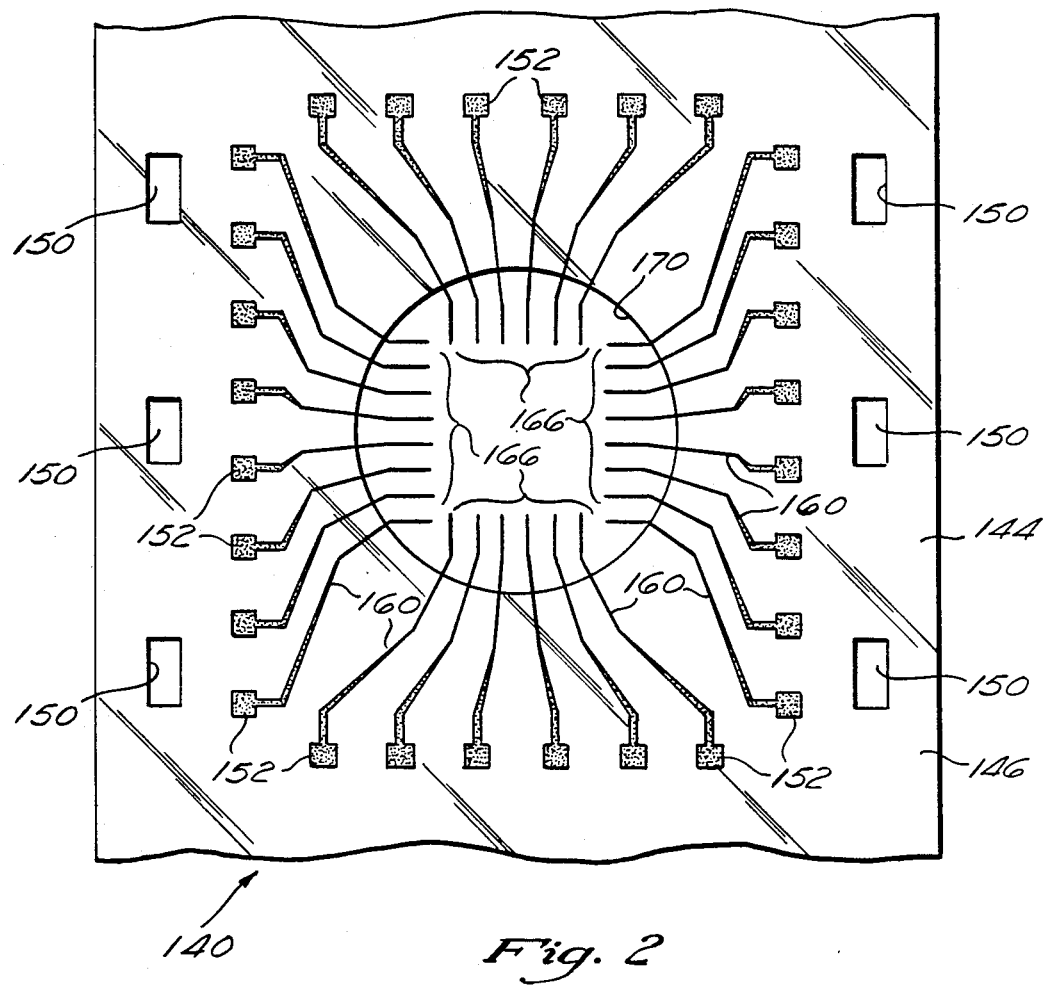
FIG. 2 is a plan view of a frame of an exemplary tape automated bonding (TAB) film having a plurality of metallic conductors thereon that are used to provide electrical interconnection to the integrated circuit die of FIG. 1.

FIG. 2 illustrates an exemplary frame of an exemplary tape automated bonding (TAB) film 140 that is used in the present invention to electrically interconnect the bonding pads 120 of the integrated circuit die 100 of FIG. 1. As illustrated, the TAB film 140 includes an insulating film substrate 144 that has a top surface 146 and a bottom surface 148 (see FIG. 3). For example, the substrate 144 may be a polyimide film, or the like. The substrate 144 includes a plurality of evenly spaced sprocket holes 150 along two edges thereof. The sprocket holes 150 are used to accurately advance and position the film substrate 144 during the production of the TAB tape 140 and when applying the TAB tape 140 to an integrated circuit, as will be described hereinafter. The TAB tape 140 includes an interconnection pattern that is applied to the top surface 146 of the insulating substrate 144. The interconnection pattern comprises a plurality of terminal pads 152 that are connected to a corresponding plurality of circuit paths or interconnection leads 160. The interconnection leads 160 converge towards the center of the frame of the TAB film 140 and are terminated in fingers or ends 166. The fingers 166 are positioned and spaced apart to correspond to the positions and spacing of the bonding pads 120 of the integrated circuit die 100.

Typically, the interconnection pattern, comprising the terminal pads 152, the interconnection leads 160 and the fingers 166, is formed on the insulating substrate by photolithographic techniques that provide for accurate alignment of the fingers 166 with respect to the sprocket holes 150. For example, the interconnection pattern can be formed by bonding a layer of copper, or other conductive material, to the top surface 146 of the insulating substrate 144 and then etching away the conductive material until only the desired pattern remains. Preferably, the portion of the insulating substrate 144 proximate to the fingers 166 is removed after forming the fingers 166 so that the fingers 166 are exposed from both sides of the TAB film 140. The boundary of the removed portion is represented by the phantom lines 170 in FIG. 2. The TAB film 140 comprises a plurality of frames of interconnecting patterns, such as the pattern illustrated in FIG. 2. The interconnection leads 160 and the fingers 166 are precisely located with respect to the locations of the sprocket holes 150 so that when the sprocket holes 150 are positioned in a known position, the locations of the interconnection leads 160 and the fingers 166 are also precisely known.

Figure 3:
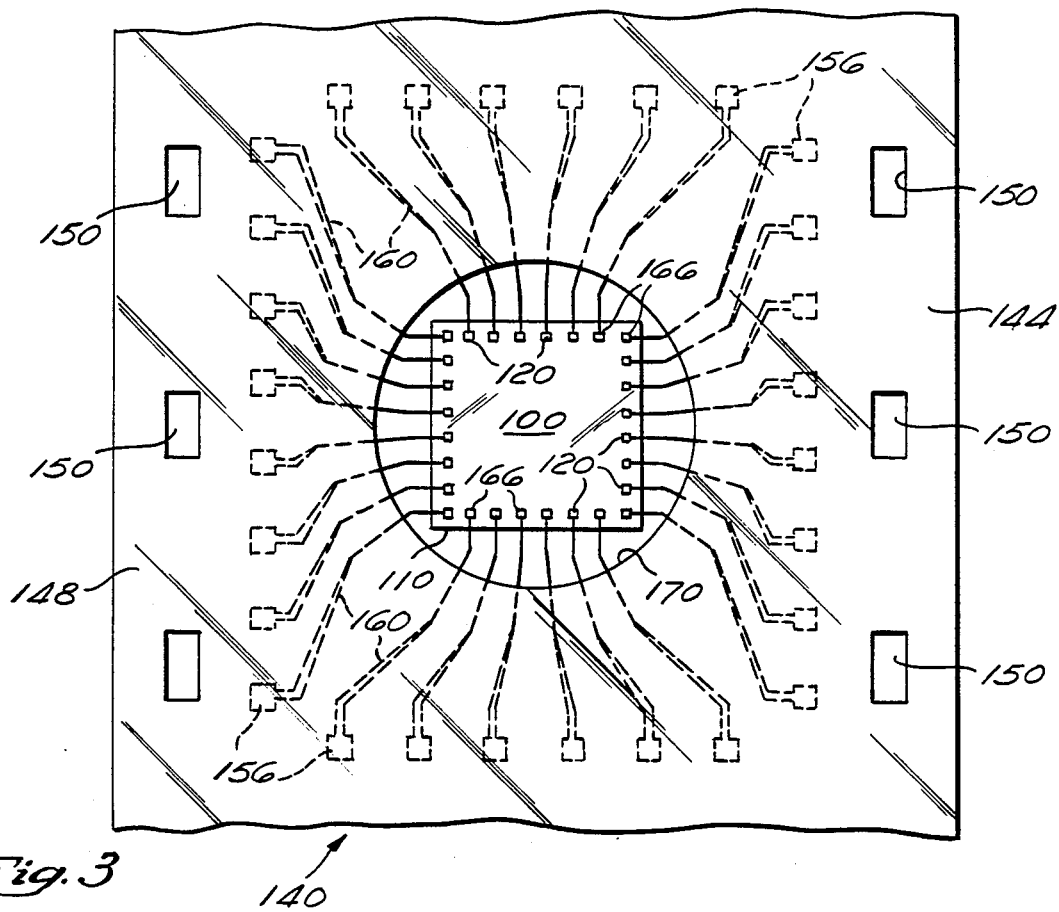
FIG. 3 is a plan view showing the integrated circuit die of FIG. 1 positioned on and electrically connected to the TAB film of FIG. 2.

The number of fingers 166 that comprise the interconnection pattern of the TAB film 140 corresponds to the number of bonding pads of the integrated circuit to which the TAB film 140 is to be applied. For example, if the TAB tape 140 of FIG. 2 is intended for the integrated circuit die 100 of FIG. 1, having 28 bonding pads 120, the interconnection pattern of the TAB tape 140 of FIG. 2 includes 28 interconnection leads or circuit paths 160 that have the fingers 166 spaced in accordance with the spacing of the bonding pads 120. This is illustrated in FIG. 3 wherein the TAB film 140 is shown overlying the top metallization surface 120 of the integrated circuit die 100, with the top surface 146 of the film 140 facing toward the top surface 110 of the integrated circuit die 100. As illustrated, the fingers 166 of the interconnection leads 160 are aligned with the bonding pads 120. The alignment of the bonding pads 120 and the fingers 166 is accomplished by utilizing the sprocket holes 150 of the TAB film 140 to accurately position the TAB film 140 so that the fingers 166 are aligned with the bonding pads 120. The TAB film 140 is available with raised bumps on the fingers 166 to increase the contact between the bonding pads 120 and the fingers 166 for some applications. (See, for example, FIGS. 5 and 6.) After the fingers 166 of the TAB film 140 are properly aligned with the bonding pads 120 of the integrated circuit die 100, the fingers 166 and the bonding pads 120 are permanently electrically interconnected by ultrasonic welding, reflow soldering, compression bonding, or other conventional methods.

TAB film, such as the TAB film 140 described herein, is available from a number of sources, such as Electronics Products Division/3M, Building 502, P.O. Box 2963, Austin, Texas 78769-2963. Further information regarding TAB film can be obtained from 3M at the above address. The use of TAB film to interconnect integrated circuits is also illustrated in U.S. Pat. No. 4,330,790 to Carmen Burns, issued on May 18, 1982. The equipment required to interconnect the TAB film 140 to the integrated circuit die 100 is commercially available equipment and will not be described herein. Briefly, the TAB film 140 is advanced to known locations in the equipment using the sprocket holes 150 to precisely position the fingers 166 of the TAB film 140 and an integrated circuit die, such as the die 100, is bonded to the fingers 166 in each frame of the TAB film 140.

Although not illustrated herein, TAB film, such as the TAB film 140, is obtainable with two or electrically isolated layers of interconnection leads to increase the number of interconnections that can be provided in a given area. For example, an integrated circuit die (not shown) may have multiple rows of bonding pads on the metallization surface, for example, an inner row and an outer row. The interconnection leads on one layer of the TAB film may be used to interconnect the outer row of the bonding pads and the interconnection leads on another layer of the TAB film may be used to interconnect the bonding pads on the inner row.

TAB film is also available for interconnecting more than one integrated circuit die and for interconnecting integrated circuits and discrete components, such as resistors, capacitors, and the like. Such TAB film is advantageously used in hybrid packages, for example.

One of the advantages of the present invention is that the bonding pads 120 of the integrated circuit die 100 are bonded to the fingers 166 of the interconnection leads 160 of the TAB film 140 in a conventional manner. Furthermore, there is no need to modify the integrated circuit die 100 in order to incorporate it into the present invention. Thus, standard off-the-shelf integrated circuit dies can be advantageously used as part of the present invention.

Although TAB film has been advantageously used to more fully automate the fabrication of integrated circuits, there are a number of problems associated with the handling of the integrated circuit die/ TAB film combination described above. One such problem is related to the size of the interconnection leads 160 on the TAB film 140. Since the interconnection leads 160 are necessarily very small, the leads 160 are also very fragile. In addition, the bonded interconnection between each interconnection lead 160 and the corresponding bonding pad 120 is relatively weak. Thus, it is not unusual for one of the interconnection leads 160 to break or for one of the bonded interconnections to disconnect during the testing of the integrated circuits or during the installation of the integrated circuit die/ TAB film combination into a larger system, such as a printed circuit board. One aspect of the present invention, described below, is to substantially reduce or eliminate such failures.

As set forth above, the integrated circuit die 100 is originally part of a wafer (not shown) having a large number of dies. The die 100 is separated from the wafer by scribing the wafer and then cutting or breaking the wafer at the scribe lines to separate the dies. The dies formed in this manner tend to be dimensionally inconsistent and thus the edges of the integrated circuit die 100 cannot be readily used as a reference for mounting the integrated circuit die 100 as part of a system of integrated circuits. Another aspect of the present invention is to provide dimensional stability for the integrated circuit die 100.

Figure 4:
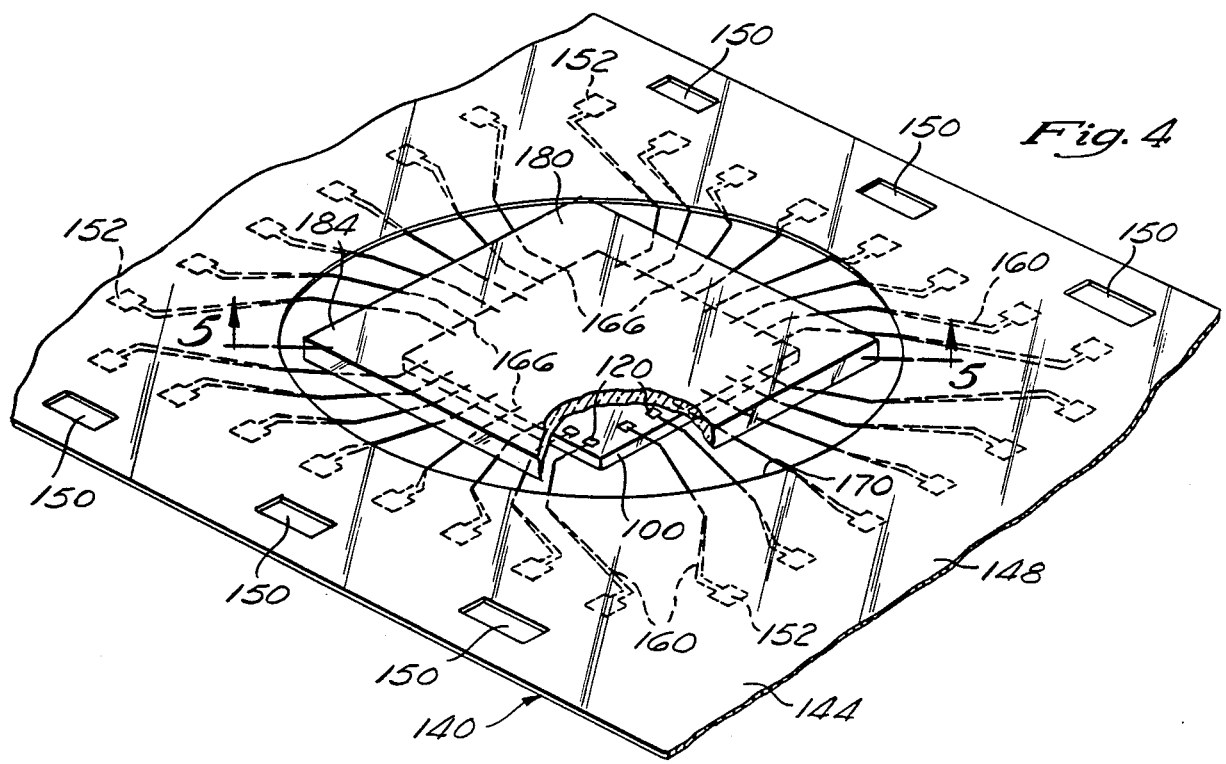
FIG. 4 is a perspective view of the integrated circuit die and TAB film combination of FIG. 3, further including a flat insulating plate bonded to the integrated circuit to sandwich the electrical conductors of the TAB film between the plate and the die.
Figure 5:
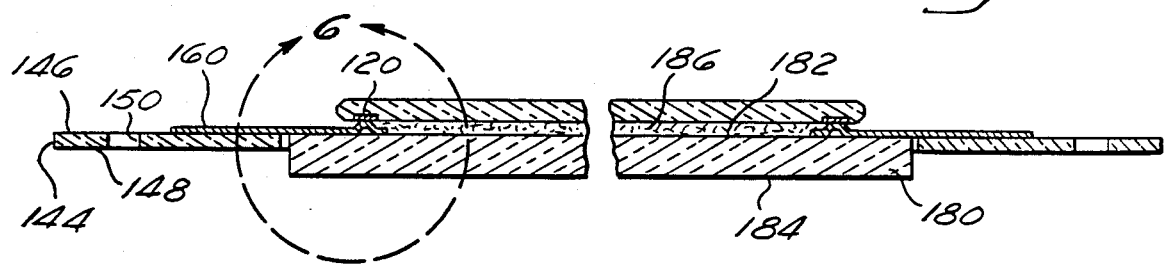
FIG. 5 is a cross-sectional view of the integrated circuit die/ TAB film/ insulating plate sandwich of FIG. 4 taken along the lines 5—5 in FIG. 4.
Figure 6:
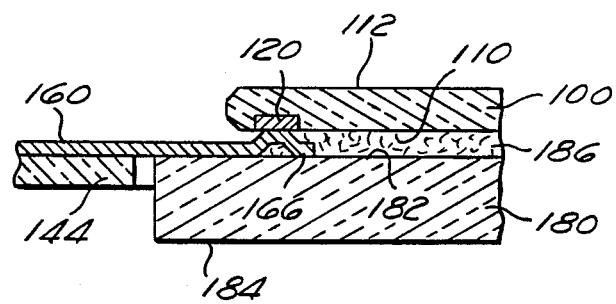
FIG. 6 is an enlarged cross-sectional view of a portion of the integrated circuit die/ TAB film/ insulating plate sandwich of FIGS. 4 and 5 as defined by the dashed line 6 in FIG. 5.

The present invention is illustrated beginning with FIG. 4. As illustrated in FIG. 4, after the fingers 166 of the interconnection pattern on the frame of TAB film 140 are bonded to the bonding pads 120 of the integrated circuit die 100, a flat, electrically insulating, thermally conductive plate 180, having a top surface 182 and a substantially parallel bottom surface 184 is applied to the top metallization surface 110 of the integrated circuit die 100 and to the interconnection leads 160 of the TAB film 140, so that the top surface 182 of the insulating plate 180 is proximate to and substantially parallel with the top surface 110 of the integrated circuit die 100. The insulating plate 180 is positioned so that the interconnection leads 160 and the fingers 166 are sandwiched between the insulating plate 180 and the integrated circuit die 100. The positioning of the insulating plate 180 with respect to the die 100 and the film 140 is illustrated in FIGS. 4, 5 and 6. The insulating plate 180 is positioned so that the center of the plate 180 is substantially centered with respect to the center of the pattern of interconnection leads 160 that are connected to the integrated circuit die 100. This is accomplished by using the sprocket holes 150 as a reference. Since the sprocket holes 150 are precisely located with respect to the pattern of interconnection leads 160, the insulating plate 160 can be positioned with respect to the position of the sprocket holes 150 and will thereby be accurately positioned with respect to the interconnection leads. As further illustrated in FIG. 4, the dimensions of the insulating plate 180 are selected to be greater than the dimensions of the integrated circuit die 100 so that the insulating plate 100 overlaps the integrated circuit die 100 in all directions. Thus, the outer periphery of the insulating plate 180 extends beyond the outer periphery of the integrated circuit die 100. Preferably, the dimensions of the insulating plate 180 are selected to be less than the dimensions of the removed portion of the insulating substrate 144, illustrated by the boundary lines 170 in FIG. 2, so that the insulating plate 180 contacts only the interconnection leads 160 and not the thicker insulating substrate 144. Thus, in this embodiment, the fingers 166 of the interconnection leads 160 are forced into good mechanical contact with the bonding pads 120 of the integrated circuit die 100. As illustrated, a portion of each interconnection leads 160 extends beyond the periphery of the flat insulating plate 180 and is therefore exposed.

Although illustrated as having rectangular dimensions, the flat insulating plate 180 can also be circular, as will be illustrated below for embodiment of FIGS. 9-15. In such cases, the diameter of the circular plate is selected to be greater than the longest diagonal of the integrated circuit die 100 so that the integrated circuit die 100 is entirely covered by the circular plate.

As illustrated above, the inclusion of the insulating plate 180 in combination with the integrated circuit die 100 effectively solves the problems described above. For example, the bonding material 186 and the insulating plate 160 secure the interconnection leads 160 in a fixed, rigid position with respect to the bonding pads 120 of the integrated circuit die 100. Thus, the fingers 166 cannot move with respect to the bonding pads 120 and therefore the possibility of breaking the bonded connection between the bonding pads 120 and the fingers 166 is substantially reduced or eliminated. Furthermore, the dimensions of the insulating plate 180 are advantageously precisely controlled so that the outer periphery of the insulating plate 180 can be used as a precise reference when the integrated circuit die/ TAB film/ insulating plate combination is incorporated into a system.

Preferably, the insulating plate 180 is bonded to the interconnection leads 160 of the TAB film 140 and to the integrated circuit die 100 using a bonding material 186. In the preferred embodiments of the present invention, the bonding material 186 is an ultraviolet light cured epoxy, such as Locktite (TM) Crystal Clear Ultraviolet Curing Adhesive.

Preferably, the insulating plate 180 has a high thermal conductivity and a high electrical resistance. Also preferably, the insulating plate 180 has a low coefficient of expansion that is close to the coefficient of expansion of the integrated circuit die 100. The insulating plate 180 may be, for example, a ceramic material, such as aluminum oxide, silicon carbide or beryllium oxide, a single crystal material, such as sapphire, or a material such as industrial grade diamond, or the like. Each of these materials has its own characteristics with respect to thermal conductivity, electrical insulation, transparency, and cost, and the selection of the material for a particular application will depend upon a number of factors, such as the amount of heat generated by the integrated circuit die 100.

In the present invention, the insulating plate 180 is preferably sapphire. In addition to the thermal and electrical characteristics described above, sapphire is transparent to optical energy, including ultraviolet light. The transparency of the sapphire makes the use of sapphire for the insulating plate 180 particularly advantageous when the bonding material 186 is an ultraviolet light cured adhesive, as used to construct the preferred embodiments of the present invention. Rather than being blocked by the plate 180, the ultraviolet light will pass through the sapphire plate 180 and will interact with the bonding material 186, such as the bonding material 186 between the insulating plate 180 and the integrated circuit die 100, to cause the bonding material 186 to cure.

After the bonding material 186 is cured, the bottom surface 112 of the integrated circuit die 100 is ground so that the distance from the bottom surface 112 of the integrated circuit die 100 to the bottom surface 184 of the insulating plate 180 is substantially constant across the entire bottom surface 112. Thus, the thickness of the sandwich formed by the integrated circuit die 100, the TAB film 140 and the insulating plate 180 is substantially constant. Furthermore, the bottom surface 112 of the integrated circuit die 100 is substantially parallel to the bottom surface 184 of the insulating plate 180. The constant thickness and the parallel surfaces of the sandwich enable the sandwich to be used in a stacked circuit assembly to be described in detail below.

Figure 7A:
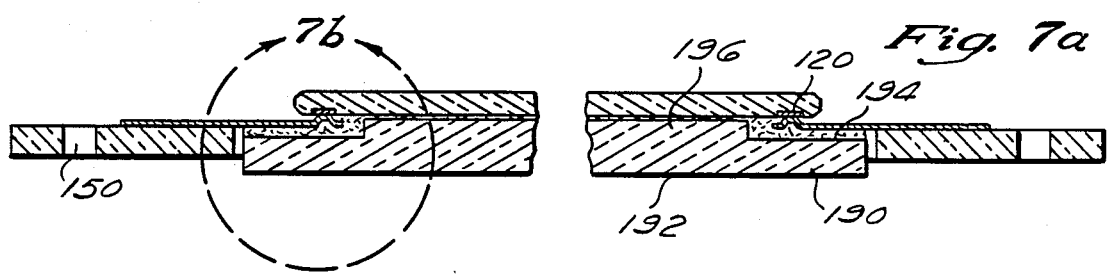
FIG. 7a is a cross-sectional view of an integrated circuit die/ TAB film/ insulating plate sandwich similar to the sandwich of FIGS. 4–6 wherein the flat insulating plate has a raised middle portion to contact the integrated circuit die.
Figure 7B:
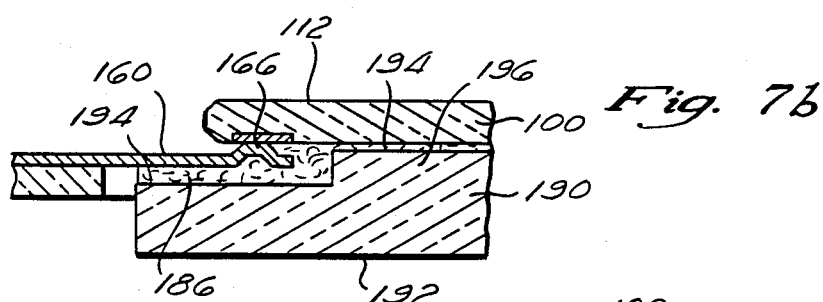

FIGS. 7a and 7b illustrate an alternative embodiment of the present invention in which the insulating plate 180 of FIGS. 5 and 6 is replaced with an insulating plate 190 that has a bottom surface 192 and a top surface 194. The top surface 194 has a raised middle portion 196. The raised middle portion 196 has dimensions that are selected so that the raised middle portion 196 occupies an area inside the area occupied by the fingers 166. Only the middle portion 196 of the insulating plate 190 contacts the top metallization surface of the integrated circuit 100. The height of the middle portion 196 is selected so that the portion of the top surface 194 that surrounds the middle portion 196 does not contact that fingers 166 or the interconnection leads 160. Thus, the distance between the bottom surface 112 of the integrated circuit die 100 and the opposing (bottom) surface 192 of the insulating plate 190 is determined by the thicknesses of the integrated circuit die 100 and the insulating plate 190, and is not dependent upon any irregularities in the thicknesses of the interconnection leads 160 or the fingers 166. Since the thickness of the integrated circuit die 100 and the thickness of the insulating plate 190 can be accurately controlled, the thickness of the overall sandwich formed by the integrated circuit die 100, the TAB film 140 and the insulating plate 190 can be made substantially constant, and the bottom surface 112 of the integrated circuit die 100 and the bottom surface 192 of the insulating plate 190 can therefore be made substantially parallel. For example, the bottom surface 112 of the integrated circuit die 100 can be precisely ground to be parallel to the bottom surface 192 of the insulating plate 190. The integrated circuit die 100, the interconnection leads 160 and the insulating plate 190 are preferably bonded together with the bonding material 186, preferably an ultraviolet cured epoxy, as with the previous embodiment. Thus, the interconnection leads 160 are held in a secure, fixed position with respect to the bonding pads 120 of the integrated circuit die 100.

Although shown as a contiguous part of the insulating plate 190, the raised portion 194 can also be a separate piece of insulating plate (e.g., sapphire) that is bonded to the insulating plate 190 during the manufacturing process. This alternative embodiment (not shown) can be used so that the flat insulating plate 190 does not have to be ground or otherwise modified to form the raised portion 194.

Figure 8:
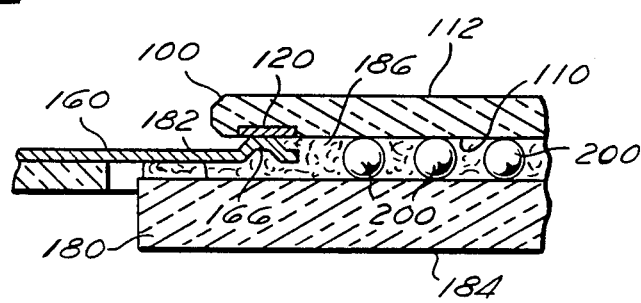
FIG. 8 is an enlarged cross-sectional view of an alternative embodiment of the integrated circuit die/ TAB film/ insulating plate sandwich of FIGS. 7a and 7b, showing a plurality of spacers between the integrated circuit die and the flat insulating plate.

FIG. 8 illustrates a further alternative of the present invention which uses the flat insulating plate 180 of FIGS. 4, 5 and 6. However, rather than mounting the insulating plate 180 directly to the interconnection leads 160 and the fingers 166, a plurality of spacers 200 are positioned between the top surface 182 of the insulating plate 180 and the top surface 110 of the integrated circuit die 100. The integrated circuit die 100, the spacers 200, the TAB film 140 and the insulating plate 180 are bonded together with the bonding material 186 to form a sandwich as before.

The spacers 200 can advantageously be glass microballoons such as are commonly used as additives to potting materials and resins, and are selected to have a uniform thickness throughout so that the overall thickness of the sandwich thus formed is constant, and so that the bottom surface 112 of the integrated circuit die 100 is substantially parallel to the bottom surface 184 of the insulating plate 180. As set forth above, the bottom surface 112 of the integrated circuit die 100 can be precisely ground to be parallel to the bottom surface 184 of the insulating plate 180.

Figure 9:
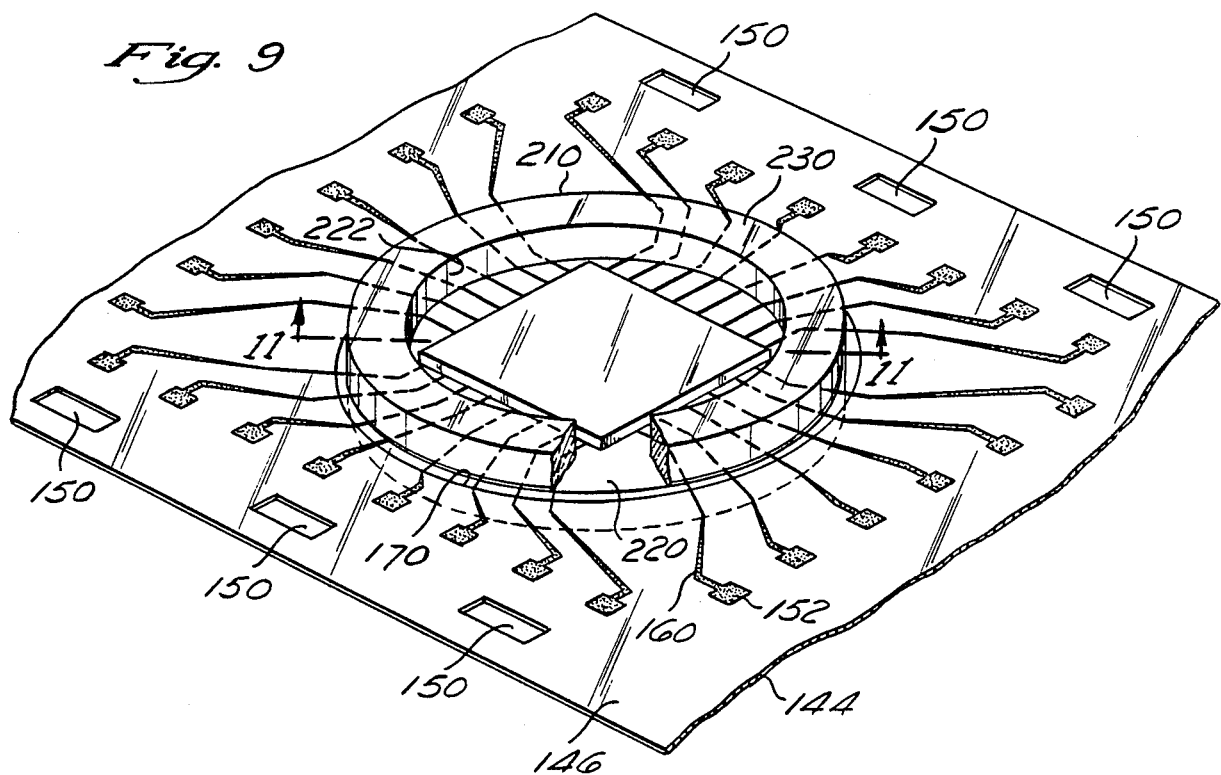
FIG. 9 is a perspective view of a preferred embodiment of the present invention that includes an integrated circuit die, a circular flat insulating plate, a frame of TAB film, and an annular clamping ring to form a sandwich.

FIGS. 9–13 illustrate a particularly preferred embodiment of the present invention that includes a clamping ring 210 of insulating material in addition to a flat insulating plate 220. As shown in FIG. 9, the clamping ring 210 is annular and has a concentric opening therein to define a cavity 222. The cavity 222 in the ring 210 has a diameter selected to be sufficiently large so that the ring 210 can surround the outer periphery of the integrated circuit die 100 without touching the edges of the die 100. Thus, the integrated circuit die 100 fits within the cavity 222. In the embodiment shown in FIGS. 9–13, the flat insulating plate 220 is also circular, and it has an outer diameter selected to be approximately the same as the outer diameter of the ring 210. Thus, the periphery of the flat plate 220 also extends beyond the periphery of the integrated circuit die 100.

Figure 10:
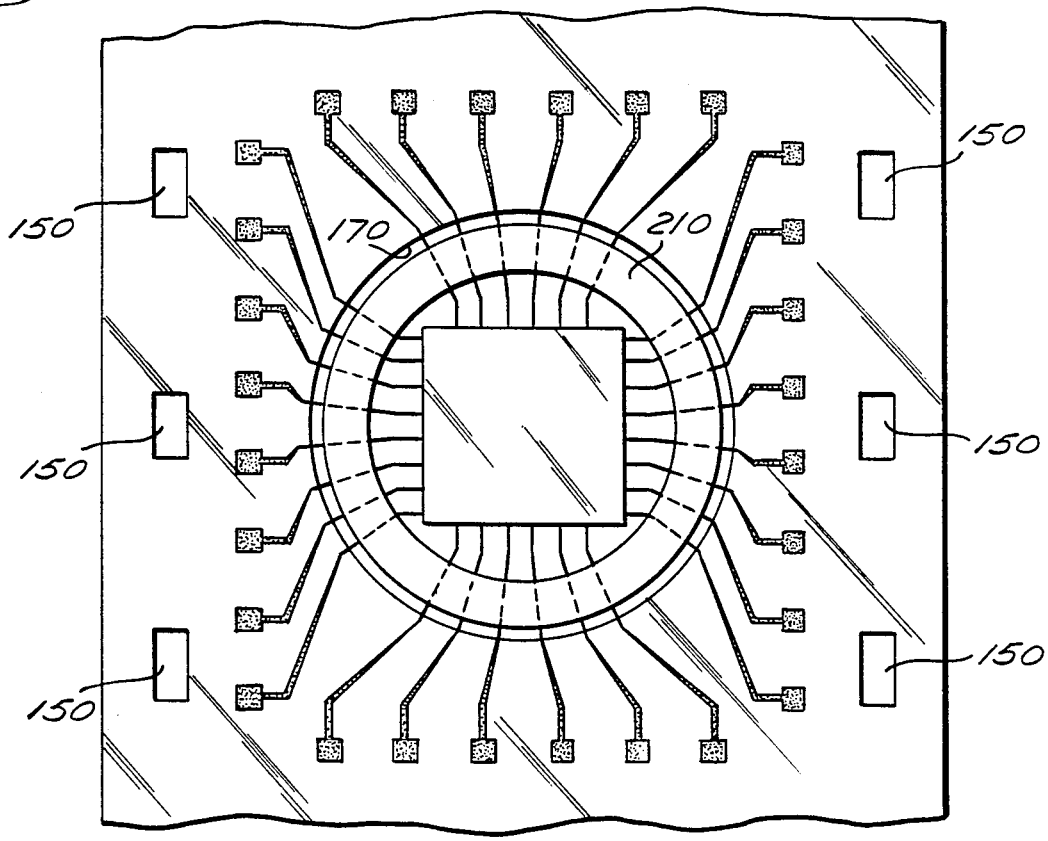
FIG. 10 is a plan view of the integrated circuit die/ TAB film/ insulating plate/ clamping ring sandwich of FIG. 9, more clearly showing the preferred radial disposition of the interconnection leads with respect to the center of the clamping ring.
Figure 11:
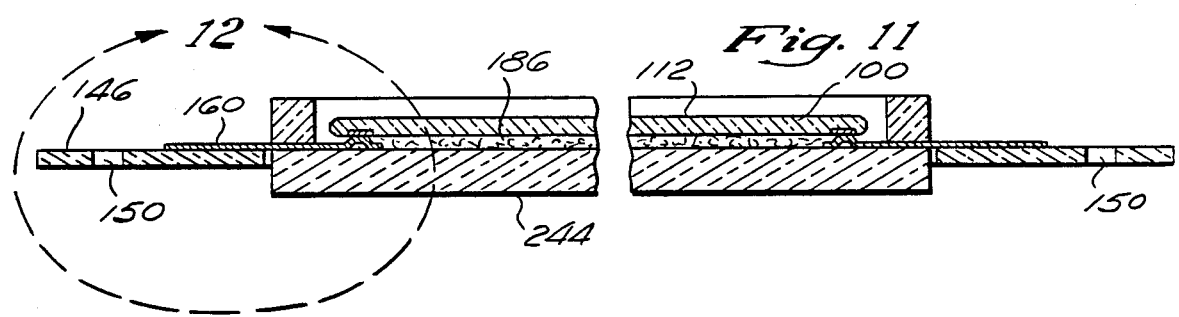
FIG. 11 is a cross-sectional view of the integrated circuit die/ TAB film/ insulating plate/ clamping ring sandwich of FIGS. 9 and 10, taken along the lines 11—11 in FIG. 9.
Figure 12:
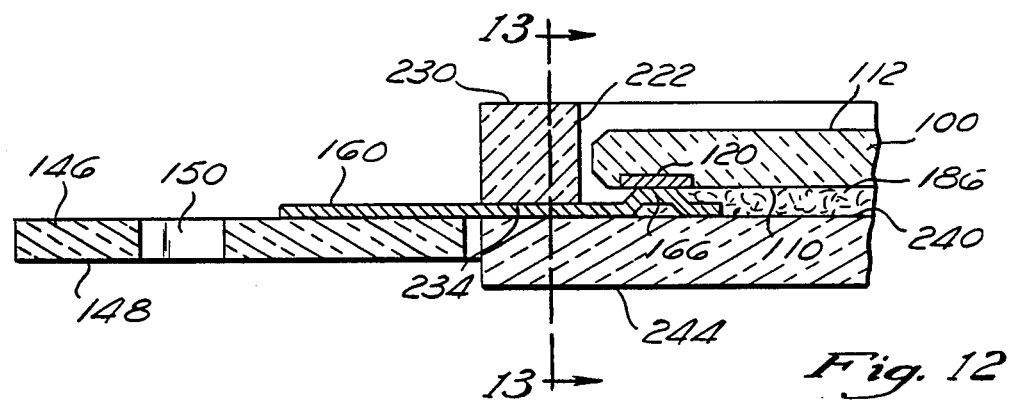
FIG. 12 is an enlarged cross-sectional view of a portion of the integrated circuit die/ TAB film/ insulating plate/ clamping ring sandwich of FIGS. 9, 10 and 11 defined by the dashed line 12 in FIG. 11.

The clamping ring 210 has a top surface 230 and a bottom surface 234. Similarly, the flat plate 220 has a top surface 240 and a bottom surface 244. The clamping ring 210 and the flat plate 220 are positioned so that outer portion of the top surface 240 of the flat plate 220 is juxtaposed with the bottom surface 234 of the ring 210 with the interconnection leads 160 of the TAB film 140 positioned therebetween so that the interconnection leads are clamped between the ring 210 and the flat plate 220. Preferably, as illustrated in FIG. 10, the portions of the interconnection leads 160 proximate to the clamping ring 210 are radially disposed with respect to the centers of the clamping ring 210 and the flat circular plate 220 so that the interconnection leads are substantially normal to the outer circumference of the clamping ring 210. Further, as illustrated, a portion of each of the interconnection leads 160 extends beyond the outer peripheries of the ring 210 and the flat plate 220 so that the portion is exposed.

Figure 13:
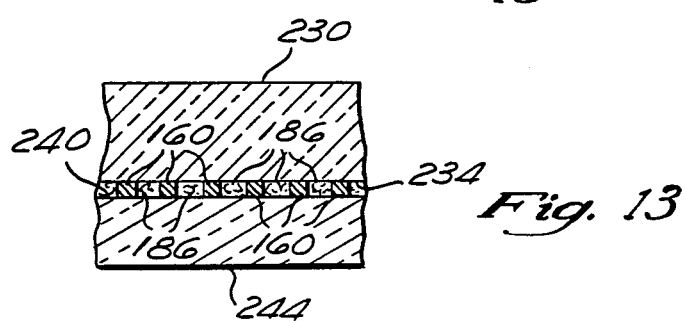
FIG. 13 is a further enlarged cross-sectional view of the integrated circuit die/ TAB film/ insulating plate/ clamping ring sandwich of FIGS. 9–12, taken along the lines 13—13 in FIG. 12 showing additional details of the interconnecting leads clamped between the flat circular plate and the clamping ring.

The clamping ring 210 and the flat plate 220 are bonded to the integrated circuit die 100 and the interconnection leads 160 using the bonding material 186, which is preferably ultraviolet light cured epoxy. The ring 210 and the flat plate 220 are securely clamped together as the bonding material 186 cures so that excess bonding material 186 is squeezed from the sandwich of materials thus formed. Thus, as illustrated in FIG. 13, substantially all of the bonding material 186 lies between the interconnection leads 160. Unlike the fingers 166 which are bonded to the bonding pads 120 and which may not have a uniform thickness, the thickness of the interconnection leads 160 are substantially uniform at the locations where the interconnection leads 160 are clamped between the ring 210 and the flat plate 220. The ring 210 and the flat plate 220 are preferably constructed from sapphire or another dimensionally stable material. Thus, the thickness of the sandwich from the top surface 230 of the ring 210 to the bottom surface 244 of the flat plate 220, including the interconnection leads 160 sandwiched between the ring 210 and the flat plate 220, is substantially constant. Furthermore, the top surface 230 of the ring 210 is substantially parallel to the bottom surface 244 of the flat plate 220. Thus, the top surface 230 of the ring 210 and the bottom surface 244 of the flat plate 220 of the embodiment of FIGS. 9-13 provide dimensionally stable surfaces when a plurality of sandwiches are stacked together, as will be described below.

The thickness of the clamping ring 210 is selected to be greater than the thickness of the integrated circuit die 100 so that the bottom surface 112 of the die 100 does not extend beyond the plane of the top surface 230 of the clamping ring 210. Thus, in this embodiment, all of the integrated circuit 100 is enclosed within the cavity 222, and any irregularities in the bottom surface 112 of the integrated circuit die 100 do not affect the thickness or parallelism of the overall sandwich. It is therefore unnecessary to grind the bottom surface 112 or otherwise modify the integrated circuit die 100 in this embodiment. Furthermore, the integrated circuit die 100 is substantially isolated from stresses that may result from the stacking of a plurality of circuits since no force is applied to the bottom surface 112 of the integrated circuit die 100.

Although the embodiment of FIGS. 9-13 is illustrated with a circular clamping ring 210 and a circular flat plate 220, it should be understood that the embodiment can also be implemented using a rectangular configuration for the clamp and the plate (not shown). For example, a rectangular clamp can be formed by sawing a rectangular opening in the middle of a solid rectangular plate. Alternatively, a rectangular clamp can be formed by juxtaposing two L-shaped sections of insulating material to form a rectangular peripheral wall surrounding a rectangular central cavity. As will be shown below, the circular configuration is particularly advantageous for stacking the integrated circuit/ TAB film/ insulating plate and clamp sandwiches.

Figure 14:
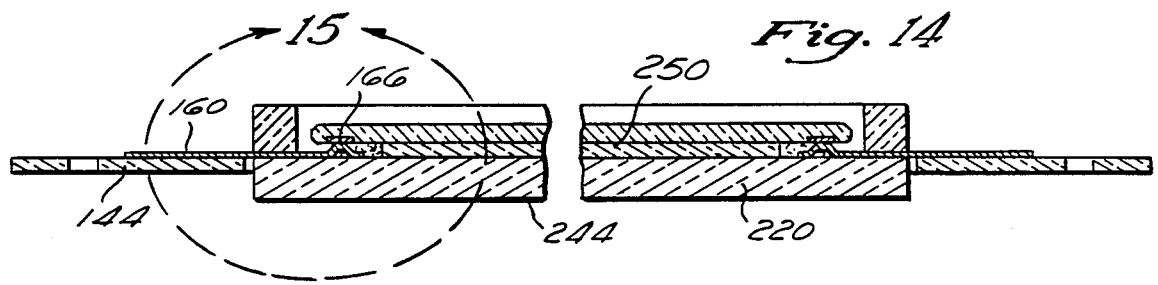
FIG. 14 is a cross-sectional view of an alternative embodiment of the integrated circuit die/ TAB film/ insulating plate/ clamping ring sandwich of FIGS. 9–13 in which the flat insulating plate includes a raised middle portion that contacts the integrated circuit die to provide a thermally conductive path from the integrated circuit die to the insulating plate.
Figure 15:
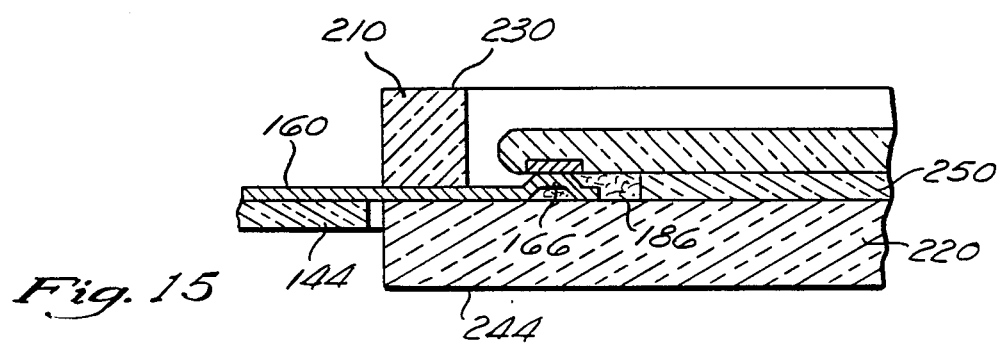
FIG. 15 is an enlarged cross-sectional view of the integrated circuit die/ TAB film/ insulating plate/ clamping plate sandwich of FIG. 14, taken along the lines 15—15 in FIG. 14.

FIGS. 14 and 15 illustrates a further alternative embodiment of the present invention that is a slightly modified version of the embodiment of FIGS. 9-13. Thus, the embodiment of FIGS. 14 and 15 is shown in cross-section only. The embodiment of FIGS. 14 and 15 includes a raised center portion 250 that is positioned on the top surface 240 of the flat plate 220 and is positioned in contact with the top surface 110 of the integrated circuit die 100. As set forth above, the raised center portion 250 may be formed as part of the flat bottom plate 220. Alternatively, as illustrated in FIG. 14 and 15, the raised center portion 250 may be a separate plate having smaller dimensions than the flat bottom plate 220 that is bonded to the top surface 240 of the flat plate 220. The use of the raised center portion 250 is particulary advantageous when the integrated circuit die 100 is a high power circuit that generates a substantial amount of heat during operation. The raised center portion 250 provides a thermally conductive path from the top surface 110 of the integrated circuit die 100 to the flat bottom plate 220 so that the heat generated by the integrated circuit die 100 can be conducted away from the die 100.

FIGS. 16, 17 and 18 illustrate a preferred embodiment of the present invention wherein a plurality of sandwiches 300, 302, 304, 306, 308, 310, etc., constructed in accordance with one of the above-described embodiments, are stacked together to form a system of integrated circuits. The sandwiches 300, 302, 304, 306, 308, 310 illustrated in FIGS. 16 and 17, are constructed in accordance with FIGS. 9-13 and FIGS. 14-15; however, one or more of the other embodiments described above can also be used. For example, the sandwich 300 is constructed in accordance with FIGS. 14-15 and includes the raised center portion 240 to provide good thermal conductivity between the integrated circuit die 100 and the flat plate 220. This construction is used, for example, for integrated circuits, such as input/output buffers/drivers that generate a relatively large amount of heat. The sandwich 302, which may be a memory circuit, or the like, is constructed in accordance with FIGS. 9-13 and does not have a raised middle portion. One or more of the sandwiches can also be constructed in accordance with one of the embodiments of FIGS. 4-9.

The system of FIGS. 16 and 17 further includes a base block 330 that is advantageously constructed from a highly thermally conductive material, such as copper, gold, or the like. The base block 330 has a top surface 332 and a bottom surface 334. The bottom surface 334 advantageously includes a threaded hole 336 that receives a removable screw 338. In order to construct the system of the present invention, the base block 330 is temporarily mounted in a hole 340 of a base plate 342 that is part of an alignment fixture 344. The hole 340 has dimensions that are closely matched to the dimensions of the base block 330 so that the base block 330 is precisely located in the base plate 342. The base block 330 is secured within the hole 340 of the base plate 342 by the screw 338 which passes through a smaller hole 346 in the base plate 342.

The alignment fixture 344 further includes a plurality (for example, six) of alignment pins 354 that are sized and positioned to precisely match the size and positions of the sprocket holes in the TAB film 140 of each of the sandwiches 300, 302, 304, 306, 308, 310. As the sandwiches 300, 302, 304, 306, 308, 310 are placed on the alignment fixture 344, the alignment pins 354 pass through the sprocket holes 150 of the sandwiches 300, 302, 304, 306, 308, 310. The alignment pins 354 are precisely positioned with respect to the base block 330 so that when the plurality of sandwiches 300, 302, 304, 306, 308, 310 are positioned on the alignment pins 354, the center of each sandwich (i.e., the center of the integrated circuit die in each sandwich) is substantially aligned with the center of the base block 330. The first sandwich 300 can be positioned directly above the base block 330 with the bottom surface 244 of the flat plate 220 proximate to the top surface 332 of the base block 330. Since the base block 330 may be constructed of a different material than the flat plate 220 of the sandwich 300, the present invention preferably includes a layer 360 of molybdenum that is interposed between the bottom surface 244 of the flat plate 220 and the top surface 332 of the base block 330. The layer 360 of molybdenum is highly thermally conductive so that the heat on the bottom surface 244 of the flat plate 220 when the system is operated will be conducted to the top surface 332 of the base block 330. The molybdenum layer 360 also serves as an expansion interface between the dissimilar materials of the flat plate 220 and the base block 330 which can each move with respect to the molybdenum without stressing the flat plate 220.

As the sandwiches 300, 302, 304, 306, 308, 310 are placed on the alignment fixture 344, a layer of bonding material 370 is placed between the top surface 230 of the clamping ring 210 of one sandwich and the bottom surface 24 of the flat plate 220 of the next higher sandwich. Preferably, the bonding material 370 is an ultraviolet light cured epoxy, such as was described above. After all of the sandwiches 300, 302, 304, 306, 308, 310 have been placed on the alignment fixture 344, a cover plate 380 of sapphire or other suitable material is placed on the top surface 330 of the clamping ring 210 of the uppermost sandwich with a layer of bonding material 370 therebetween. The entire assembly is securely clamped between the cover plate 380 and the bottom of the alignment fixture 344 and pressure is applied as ultraviolet light is applied to the system to cure the bonding material 370. Thereafter, the screw 338 is released and the assembly of the sandwiches 300, 302, 304, 306, 308, 310 and the base block 330 is removed from the alignment fixture 344.

As illustrated in FIG. 17, the perimeter of the flat circular plate 220 of one sandwich layer abuts the clamping ring 210 of the next lower sandwich layer in the stack of sandwiches. Furthermore, the clamping ring 210 and the flat circular plate 220 of each sandwich are thermally interconnected by the interconnection leads 160 and the bonding material 370. Within each sandwich, the integrated circuit die 100 is thermally connected to the flat circular plate 220 and the clamping ring 210 via the bonding material 186. Thus, a continuous thermal conduction path is provided from each integrated circuit die 100 to the base block 330 of the stack. Furthermore, as described above, the thermal conduction path for integrated circuits having relatively high power outputs can be improved by using the embodiment of FIGS. 14-15 to include the raised middle portion 250. Also, the sandwiches having the higher power integrated circuits can advantageously be located closer to the base block 330 to reduce the length of the thermal conduction path from the integrated circuit to the base block 330.

Although described above with respect to the embodiments of FIGS. 9-15, it should be understood that the stack 400 can also be constructed with sandwiches built in accordance with the embodiments of FIGS. 4-8. As set forth above, the bottom surfaces 112 of the integrated circuit dies 100 in each sandwich constructed in accordance with FIGS. 4-8 are ground, if necessary, to assure that the bottom surfaces 112 of the dies 100 are substantially parallel with the corresponding bottom surfaces 184 of the insulating plates 180. Thus, a stack including such embodiments is dimensionally stable. When such embodiments are used, it is preferable that sufficient bonding material 370 be applied between the sandwich layers to provide a continuous, thermally conductive path from one sandwich layer to the next lower sandwich layer. Preferably, the bonding material 370 fills the gap between the periphery of the top surface 182 of one insulating plate 180 and the bottom surface 184 of the next higher insulating plate 180.

After removing the assembly of sandwiches from the alignment fixture 344, the portions of the TAB film 140 extending outside the circular flat plates 220 and the annular rings 210 are removed so that the assembly forms a cylindrical stack 400 of sandwiches as illustrated in FIG. 18. For example, the excess TAB film 140 can be removed with a knife, or the like, to expose the radially disposed interconnection leads 160 proximate to the outer circumference of the clamping ring 210. Thus, the outer circumference of the cylindrical stack 400 comprises a plurality of ends 410 of the metallic interconnection leads 160.

After removing the excess TAB film 140, the base block 330 of the cylindrical stack 400 is preferably mounted in a collet 414 (see FIG. 19) which is in turn mounted in a lathe (not shown), or the like, so that the cylindrical stack 400 can be rotated about an axis of symmetry 420 of the cylindrical stack 400. The base block 330 preferably includes an index slot 416. The collet 414 preferably includes an index pin 418 that is engageable with the index slot 416 to secure the base block 330 within the collet 414. As the cylindrical stack 400 is rotated, the outer circumference of the cylindrical stack 400 is ground and polished to a precise cylindrical dimension using a diamond cutting wheel (not shown), or the like. This is accomplished by moving the cutting wheel axially along the outer circumference of the cylindrical stack 400 as it is rotated. The cylindrical stack 400 is ground to a diameter that is slightly less than the original diameters of the clamping rings 210 and the flat circular plates 220 so that the outer circumferences of all of the sandwiches are substantially identical irrespective of any initial differences in diameter and any small alignment errors. Furthermore, the outer circumference of the cylindrical stack 400 has a smooth, polished finish after the grinding and polishing operation is completed. As illustrated, the grinding and polishing operation does not expose the integrated circuit dies 100 which are enclosed within the outer walls of the cylindrical stack 400. Thus, the integrated circuit die 100 is not directly affected by the grinding and polishing operation.

After grinding and polishing the outer circumference of the cylindrical stack 400, the outer circumference is cleaned to remove any residue from the grinding and polishing operation. Thereafter, the exposed ends 410 of the interconnection leads 160 of the stacked sandwiches are interconnected. For example, the exposed ends 410 can be interconnected by point-to-point wiring wherein one end of an insulated wire is bonded to an exposed end 410 of an interconnection lead 160 by compression or ultrasonic welding, or the like, and the insulated wire is then positioned on and bonded to an exposed end 410 of another interconnection lead 160. The exposed ends 410 can also be interconnected by an electrically conductive thick film, such as an epoxy, that is applied to the cylindrical stack 400 by silk screening, or the like. Alternatively, the exposed ends 410 can be interconnected with a flexible printed circuit board (not shown). For example, the flexible printed circuit board can be constructed in a manner similar to the construction of the TAB film 140, and the flexible printed circuit board can advantageously include multiple interconnection layers.

In one preferred embodiment of the invention, illustrated in FIGS. 18–22, techniques similar to conventional printed circuit board techniques are used to interconnect the exposed ends 410. For example, a thin layer of gold, copper or other suitable electrically conductive material is sputtered onto the outer circumference of the cylindrical stack 400 to form an electrically conductive (e.g., metallic) base layer (not shown). Thereafter, the cylindrical stack 400 is electroplated with additional gold or copper over the base layer to provide a layer 440 of metal (see FIG. 20) having a thickness of 0.0002 to 0.0015 inches. A layer 450 of a photo-resistant coating material is then applied to the cylindrical stack 400 over the metal layer 440. The photo-resistant coating layer 450 is advantageously applied by again rotating the cylindrical stack in a lathe (not shown) and by pressing a foam sponge with the photo-resistant material thereon against the rotating cylindrical stack 400. This procedure causes the layer 450 of the photo-resistant material to be smooth and even. After the photo-resistant layer 450 is applied, the photo-resistant material is allowed to cure.

After the photo-resistant material layer 450 has cured, the cylindrical stack is again placed in the collet 414. The collet 414 is secured within a wiring tool 460 that includes a motor (not shown) for precisely rotating the collet 414 in small angular steps, and includes an controlled light source 470 that is moveable axially with respect to the cylindrical stack 400. The light source 470 produces a light beam (represented by a line 474) that can be switched on an off (e.g., by selectively providing power to the filament of a bulb or by selectively positioning a shutter in the path of the light beam 474). The light source 470 preferably includes a lens assembly 478 having an adjustable focus so that the diameter of the beam 474 can be varied.

As is well known in the art, when the photo-resistant material comprising the layer 450 is exposed to light, the portion exposed hardens so that it is not readily dissolved by a solvent, such as alcohol, xylene, or the like. The unexposed portions of the material are readily dissolved by the solvent. Thus, by selectively exposing portions of the material to light, a pattern of hardened photo-resistant material can be formed that will remain after the unexposed portions are dissolved by the solvent. In accordance with the present invention, the exposure of the photo-resistant material layer 450 is accomplished by selectively positioning the light source 470 over the portions to be exposed. For example, the light source 470 is positioned so that the light beam 474 is directed at one of the exposed ends 410. Thereafter, the light source 470 is moved axially (i.e., vertically in FIG. 18) along the cylinder 400 to expose other portions of the photo-resistant material layer 450, thereby creating a path of hardened photo-resistant material. The paths of hardened photo-resistant material define metallic electrical interconnections as will be discussed below. For example, a line 480 in FIG. 18 represents a path that interconnects two axially adjacent exposed ends 410.

A circumferential (i.e., horizontal) path of hardened photo-resistant material 450 can be formed by rotating the collet 414 while holding the light source 470 in a fixed axial location. Such a path is represented by a line 484 in FIG. 18. A combination of axial movement of the light source 470 and angular (i.e., rotational) movement of the collet 414 can provide a path at an angle with respect to both the axial and circumferential paths. The width of the paths thus created is determined by the diameter of the light beam 474 and can be varied in accordance with the desired width of the metallic interconnection defined by the path. The light source 470 and/or the collet 414 can be moved without creating a hardened path by switching off the light beam 474 prior to movement.

The foregoing description of the operation of the light source is very similar to the operation of a light source in a conventional printed circuit manufacturing system. For example, the axial movement of the light source 470, the angular movement of the collet 414, and the switching and focusing of the light beam 474 are controllable by a program in a computer, a numeric control tape, or the like, in a conventional manner.

Alternative methods (not shown) for exposing the photo-resistant material include contact printing, projection printing, or the like. For example, in the contact printing method, the interconnection pattern is provided as a pattern of transparent and opaque portions of a flexible photographic material that is positioned proximate to the photo-resistant material. Thereafter, the photographic material is exposed to light from a light source. The transparent portions of the film will allow light to pass through and expose the portions of the photo-resistant material lying under the transparent portions, and the opaque portions of the film will block the light and prevent the exposure of the portions of the photo-resistant material lying under the opaque portions.

After all of the desired interconnection paths are defined by exposing the photo-resistant material with the light beam 474 from the light source 470, the photo-resistant material on the cylindrical stack 400 is developed, such as by placing the cylindrical stack in a solvent, such as alcohol or xylene, to remove the unexposed photo-resistant material in the layer 450, thus revealing the portions of the metallic layer 440 thereunder. The exposed portions of the photo-resistant material continue to protect the portions of the metallic layer beneath the exposed portion. The cylindrical stack is then placed in an etching solution (not shown) such as ferric chloride for a copper metallic layer 440 or aqua regia for a gold metallic layer 440. The portions of the metallic layer 440 protected by the hardened photo-resistant material are substantially unaffected by the etching solution while the unprotected portions of the metallic layer 440 are etched away. Thus, metallic interconnection paths defined by the exposed photo-resistant material are produced to interconnect the exposed ends 410 of the interconnection leads 160.

Exemplary interconnection paths 496, produced in accordance with the foregoing description, are illustrated in FIGS. 21 and 22. As illustrated in FIG. 21, in addition to interconnecting the exposed ends 410 of the interconnection leads 160, the interconnection paths provide a plurality of terminal pads 498 along the lower portion of the cylindrical stack 400. As further illustrated in FIG. 21, the base block 330 of the cylindrical stack 400 is positioned in a ceramic base plate 500 that is similar to a conventional ceramic chip carrier. The ceramic base plate 500 has an upper surface 504 and a lower surface 508. The upper surface 504 of the ceramic base plate 500 has a hole 512 in the center thereof that is shaped and sized to receive the base block 330. The lower surface 508 of the ceramic base plate 500 includes a plurality of connector pins 520 similar to those found on a conventional ceramic chip carrier. The connector pins 520 are connectable to a printed circuit board in a conventional manner. Other interconnection methods could also be used. For example, bonding pads (not shown) such as are commonly used with conventional surface mount technology can be disposed along the periphery of the ceramic base plate 500.

The ceramic base plate 500 further includes a plurality of metallic vias 522 that pass through the base plate 500 from the lower surface 508 to the upper surface 504 and electrically interconnect the connector pins 520 with corresponding electrical conductors 524 on the top surface 504. The electrical conductors 524 are terminated on the top surface 504 proximate to the hole 512. The electrical conductors 524 are electrically interconnected to the terminal pads 498 of the electrical interconnection paths 496 with a plurality of interconnection wires 540. The interconnection wires 540 can be connected to the electrical conductors 524 and the terminal pads 498 in accordance with the method illustrated in FIGS. 23-26. As illustrated in FIG. 23, the ceramic plate 500 and the cylindrical stack 400 are positioned in a wire bonding machine (not shown) that includes a conventional wire bonding head 554. For example, the wire bonding head 554 advantageously can be substantially similar to a wire bonding head that is used to interconnect integrated circuit dies and chip carriers in conventional manufacturing processes. The wire bonding head 554 operates to electrically and mechanically interconnect on end of a wire 560 to an one of the electrical conductors 524 on the top surface 504 of the ceramic base plate 500. Thereafter, the wire bonding head 554 is moved away from the top surface 504 of the ceramic base plate 500, and the ceramic base plate 500 and cylindrical stack 400 are pivoted so that the terminal pad 498 of one of the interconnection paths 496 is positioned beneath the wire bonding head 554, as illustrated in FIG. 24. Then the wire bonding head 554 is lowered to the terminal pad 498 and the wire 560 is electrically and mechanically connected to the terminal pad 498. Thereafter, the wire bonding head 554 is again lifted and the ceramic base plate 500 and cylindrical stack 400 pivoted to the original position. Also, the cylindrical stack 400 is rotated about its axis of symmetry 420 so that a new electrical conductor 524 is positioned beneath the wire bonding head 554.

The steps illustrated in FIGS. 23-26 are repeated until all the terminal pads 498 are connected to corresponding electrical conductors 524. Thereafter, the connector pins 520 on the bottom surface 508 of the ceramic base plate 500 are connected to a printed circuit board, or the like, (not shown) to provide electrical interconnection to the cylindrical stack 400, and thus to the integrated circuit dies 100 within the cylindrical stack 400.

The ceramic base plate 500 can further include additional interconnection wiring (not shown) and discrete components (not shown) to provide signal and power conditioning for the integrated circuits in the stack 400. For example, decoupling capacitors can be mounted on the base plate 500 to attenuate high frequency noise from the signals and the power inputs.

Preferably, after the stack 400 is mounted to the ceramic base plate 500 and electrically interconnected as described above, the stack 400 is enclosed within a container (not shown) to protect the stack 400 from damage. In addition, the container can advantageously include cooling fins, or the like, to assist in removing thermal energy from the stack 400.

The present invention is particularly advantageous in constructing systems of integrated circuits because the interconnections between the integrated circuit dies 100 within the cylindrical stack 400 are provided by the relatively high density interconnections on the circumference of the stack 400. Although printed circuit boards for interconnecting integrated circuits with such large numbers of leads are extremely difficult to design and build, the present invention substantially reduces the design effort required since a large number of the interconnections are typically bus connections that can be accomplished with a short conductive path between two vertically adjacent pins. The signals between the integrated circuit dies 100 can be very short and it is not necessary to route these signals to a printed circuit board as in conventional systems. It is only necessary to connect the input and output signals to the system through the ceramic base plate 500 and to the printed circuit board. For example, the cylindrical stack 400 can advantageously be an entire computer system with a processing unit, memory storage units, and controller units. The various units are preferably connected together with the interconnection paths 496 on the circumference of the cylindrical stack 400. Thus, rather than requiring extensive printed circuit board wiring interconnections as in conventional systems, only those signals necessary to communicate with external devices such as magnetic storage units, displays, keyboards, and the like, need be routed through the ceramic base plate to a printed circuit board. Therefore, there is a considerable saving in both printed circuit board complexity as well as printed circuit board complexity.

Although described above with respect to an integrated circuit die having 28 interconnection leads, the present invention is suitable for interconnecting integrated circuit dies having large numbers of leads (e.g., in excess of 200 leads). In addition, it is not necessary that each of the integrated circuits in each of the sandwich layers have the same number of interconnection leads 160. So long as the interconnection leads 160 are accurately positioned with respect to a known alignment feature (i.e., the sprocket holes 150 in the TAB film 140), the exposed portions of the interconnection leads 160 are readily connectable, as described above.

Although the present invention can advantageously be used with standard off-the-shelf integrated circuits, the present invention is particularly advantageous when used with integrated circuits designed to provide a large number of signal outputs from each circuit on a "wide" (i.e., many signal leads) bus. Unlike prior systems where considerable effort has been expended to reduce the number of input/output connections of an integrated circuit, for example by multiplexing signals, the present invention is particularly suited to utilize a large number of interconnections. This is feasible since there is no requirement that each of the integrated circuit leads go to printed circuit board. Rather, a large number of interconnections between integrated circuit dies can be accomplished by short point-to-point wiring between adjacent sandwiches. Thus, for example, a common bus structure can be provided similar to the bus structure in a personal computer. Each integrated circuit in the stack of integrated circuits has access to each signal on the bus; however, each integrated circuit only receives signals from or transmits signals to that portion of bus that is relevant to that integrated circuit.

Although described above in connection with the circular embodiments of FIGS. 9–13 and 14–15, it should be understood that the stacked system of the present invention can also be advantageously constructed using the rectangular embodiments of FIGS. 4–8. Such an embodiment is illustrated in FIG. 27 as a stack 600 of rectangular sandwiches having four flat faces. In the embodiment of FIG. 27, the grinding and polishing operation is accomplished by moving the flat faces and a grinding and polishing tool laterally with respect to each other. The interconnections of the exposed ends of the electrical conductors of the TAB film is accomplished by the etching techniques described above. Each of the four flat faces of the stack 600 is similar to a convention planar printed circuit board, and the steps of exposing and etching the photo-resistant material can be accomplished using substantially conventional techniques.

The above-described stacks 400 and 600 are particularly advantageous when constructed with insulating plates, such as sapphire, that are optically transparent. As set forth above, the optically transparent flat plates permit optical energy to pass through the plates to the preferred ultraviolet light curable bonding material. In addition, the optically transparent plates are advantageous after the stacks 400 and 600 are constructed. For example, one or more of the integrated circuit dies 100 in the sandwich layers can advantageously be an erasable programmable read only memory (EPROM), such as are commercially available. Many versions of such EPROM's are erasable by applying ultraviolet light to the integrated circuit die that comprises the EPROM. The transparency of the insulating plates permits the optical energy to pass through the plates to the integrated circuit dies to erase the EPROM's. In such applications, the stacks 400 and 600 are covered with an opaque material other than when it is desired to erase the EPROM's.

The foregoing embodiments have been described with respect to a single integrated circuit per sandwich layer. As set forth above, TAB film is also available that provides interconnecting leads for interconnecting multiple integrated circuit dies and for connecting integrated circuit dies and discrete components in the same film frame. Such interconnected circuits and components can advantageously be included on one or more of the sandwich layers. For example, a sandwich layer can include decoupling capacitors for the interconnection leads that provide power to the integrated circuit die on the layer. Additional sandwich layers can be provided to connect discrete components such as may be used for terminating input and output lines and the like.

What is claimed is:

1. An apparatus for interconnecting a plurality of integrated circuits in a stack, comprising:
    a plurality of sandwiched structures, each sandwiched structure comprising:
    an integrated circuit die having a plurality of bonding pads on an active surface thereof, said active surface of said integrated circuit die having an outer periphery;
    a first set of electrical conductors, said first set of electrical conductors electrically and mechanically bonded to said bonding pads of said integrated circuit die; and
    a first electrically insulating plate attached to said integrated circuit die, said first electrically insulating plate having a planar surface and an edge, said edge forming an outer periphery of said first electrically insulating plate with dimensions selected so that said outer periphery of said first electrically insulating plate extends beyond the outer periphery of said surface of said integrated circuit die and so that an exposed portion of a plurality of conductors of said first set of electrical conductors extends to the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the active surfaces of the integrated circuit dies in at least two of said sandwiched structures face in the same direction; and
    a second set of electrical conductors formed on said common outer surface of said stack that electrically interconnects exposed portions of a plurality of conductors of said first set of electrical conductors of one of said sandwiched structures with exposed portions of a plurality of conductors of said first set of electrical conductors of others of said sandwiched structures.

2. The apparatus as defined in claim 1, wherein said first electrically insulating plate comprises sapphire.

3. The apparatus as defined in claim 2, wherein said first electrically insulating plate is circular.

4. The apparatus as defined in claim 1, wherein at least one of said sandwiched structures further includes a second electrically insulating plate having a centrally disposed cavity therein, said second electrically insulating plate positioned on said first set of electrical conductors so that said first set of electrical conductors are positioned between said second electrically insulating plate and said first electrically insulating plate.

5. The apparatus as defined in claim 4, wherein said integrated circuit die is positioned within said centrally disposed cavity of said second electrically insulating plate.

6. The apparatus as defined in claim 5, wherein said first and second electrically insulating plates comprise sapphire.

7. The apparatus as defined in claim 5, wherein said first and second electrically insulating plates are thermally conductive.

8. The apparatus as defined in claim 4, wherein said first and second electrically insulating plates are circular.

9. The apparatus as defined in claim 1, wherein said first plurality of electrical conductors of each sandwiched structure are formed as a pattern on a frame of tape automatic bonding (TAB) film.

10. The apparatus as defined in claim 9, wherein each said frame of TAB film includes a plurality of sprocket holes and wherein said plurality of sprocket holes align said plurality of sandwiched structures when said sandwiched structures are being stacked.

11. The apparatus as defined in claim 10, wherein said plurality of sandwiched structures are bonded together with an adhesive, and wherein said sprocket holes align said plurality of sandwiched structures until said adhesive is cured.

12. The apparatus as defined in claim 9, wherein said frame of TAB film includes a plurality of sprocket holes aligned with said pattern of said first set of electrical conductors, and wherein said first electrically insulating plate is aligned with said sprocket holes so that said first electrically insulating plate is aligned with said first set of electrical conductors.

13. The apparatus as defined in claim 1, wherein said second set of electrical conductors that interconnect the exposed portions of said first sets of electrical conductors of said sandwiched structures comprises a layer of metal having portions of said metal removed to form said second set of electrical conductors.

14. An apparatus for packaging integrated circuits, comprising:
an integrated circuit die having a plurality of bonding pads on a first die surface thereof;
a plurality of electrical conductors electrically bonded to said bonding pads of said integrated circuit die, said plurality of electrical conductors comprising the electrical conductors of a frame of tape automated bonding (TAB) tape; and
a plate of thermally conductive, electrically insulating material having a first plate surface and a second plate surface, each said surface having an outer periphery, said outer periphery of each said surface encompassing an area greater than the size of said integrated circuit die so that said integrated circuit die does not extend to said outer periphery, said first plate surface positioned proximate to said first die surface of said integrated circuit die so that said plurality of electrical conductors are disposed between said first die surface and said plate, said plurality of electrical conductors having lengths selected so that said plurality of electrical conductors extend to said outer periphery of said first plate surface with at least a portion of each of said electrical conductors exposed at said outer periphery of said first plate surface, said plate adhesively bonded to said first die surface and said electrical conductors.

15. The apparatus as defined in claim 14, wherein said plate of thermally conductive, electrically insulating material comprises sapphire.

16. The apparatus as defined in claim 14, wherein said first plate surface is bonded to said first die surface.

17. The apparatus as defined in claim 14, wherein said first plate surface has a raised central portion and an outer peripheral portion, said raised central portion bonded to said first die surface, said outer peripheral portion proximate to but spaced apart from said plurality of electrical conductors.

18. The apparatus as defined in claim 14, wherein:
said integrated circuit die has a second die surface opposite said first die surface; and
said second die surface is positioned to be substantially parallel to said second plate surface.

19. The apparatus as defined in claim 18, wherein said second die surface is positioned to be substantially parallel to said second plate surface by grinding said second die surface.

20. The apparatus as defined in claim 14, further including a second thermally conductive, electrically insulating plate, said second plate having a cavity formed therein, said second plate positioned proximate to said first plate so that said plurality of electrical conductors is clamped between said first plate and said second plate and so that said integrated circuit die is positioned within said cavity of said second plate.

21. The apparatus as defined in claim 20, wherein said first and second thermally conductive, electrically insulating plates comprise sapphire.

22. The apparatus as defined in claim 20, wherein said first and second plates are circular.

23. The apparatus as defined in claim 20, wherein said second plate has first and second substantially parallel surfaces, said first surface of said second plate positioned in juxtaposition with said first surface of said first plate with said plurality of conductors therebetween, said second surface of said second plate positioned to be substantially parallel to said second surface of said first plate.

24. The apparatus as defined in claim 14, wherein said frame of TAB film has a plurality of sprocket holes that provide alignment of said conductors with said bonding pads on said first die surface and alignment of said conductors with said first plate.

25. An apparatus for interconnecting a plurality of electrical circuits in a stack, comprising:
a plurality of sandwiched structures, each sandwiched structure comprising:
an electrical circuit having a plurality of electrical interconnections on at least a first surface of a substrate, said electrical circuit constrained to an area having an outer periphery;
a first set of electrical conductors, said first set of electrical conductors electrically connected to said electrical circuit on said first surface of said substrate; and
a first electrically insulating plate adhesively bonded to said electrical circuit, said first electrical insulating plate having a planar surface and an edge, said edge forming an outer periphery of said first insulating plate with dimensions selected so that said outer periphery of said first electrically insulating plate extends beyond the outer periphery of said area in which said electrical circuit is located, and so that exposed portions of a plurality of conductors of said first set of electrical conductors extends beyond the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the first surfaces of the substrates of at least two of said sandwiched structures face in the same direction; and
a second set of electrical conductors formed on said common outer surface of said stack that electrically interconnect the exposed portions of a plurality of conductors of said first set of electrical conductors of one of said sandwiched structures with the exposed portions of a plurality of conductors of said first set of electrical conductors of others of said sandwiched structures.

26. The apparatus as defined in claim 25, wherein said electrical circuit comprises an integrated circuit die.

27. An apparatus for interconnecting a plurality of integrated circuit dies in a stack to provide short electrical interconnection paths between the dies, comprising:
a first layer comprising:
- a first insulating mounting surface having a peripheral edge;
- a first integrated circuit die fastened to said first insulating mounting surface, said first integrated circuit die having a plurality of bonding pads on a bonding surface thereof, said bonding surface of said first integrated circuit die being substantially parallel to said first insulating mounting surface, said bonding pads providing connections for signals to and from said first integrated circuit die; and
- a first set of interconnection leads connected to said bonding pads and extending to said peripheral edge of said first insulating mounting surface;

a second layer comprising:
- a second insulating mounting surface having a peripheral edge, said second insulating mounting surface being substantially parallel to said first insulating mounting surface, at least a portion of said peripheral edge of said second insulating mounting surface conforming in shape with, and positioned adjacent to a corresponding portion of said peripheral edge of said first insulating mounting surface to form a common outer surface of said stack;
- a second integrated circuit die fastened to said second insulating mounting surface, said second integrated circuit die having a plurality of bonding pads on a bonding surface thereof, said bonding surface of said second integrated circuit die facing in the same direction as said bonding surface of said first integrated circuit die, said bonding pads providing connections for signals to and from said second integrated circuit die; and
- a second set of interconnection leads connected to said bonding pads and extending to said portion of said peripheral edge of said second insulating mounting surface; and
- interconnections formed on said common outer surface of said stack to provide electrical interconnections between bonding pads positioned in like locations on said bonding surface of said first and second integrated circuit dies.

28. The apparatus as defined in claim 27, wherein at least one of said interconnections between a first bonding pad on said bonding surface of said first integrated circuit die and a second bonding pad positioned in a like location on said bonding surface of said second integrated circuit die comprises only: (a) a first interconnection from said first bonding pad to the peripheral edge of said first insulating surface, (b) a second interconnection from said second bonding pad to the peripheral edge of said second insulating surface, and (c) a third interconnection from said first interconnection to said second interconnection along said common outer surface of said stack formed by said corresponding portions of said peripheral edges of said first and second insulating mounting surfaces.

29. An apparatus for interconnecting a plurality of integrated circuit dies in a stack to provide short electrical interconnection paths between the dies, comprising:
a first layer comprising:
- a first insulating mounting surface having an outer perimeter, at least a portion of said outer perimeter of said first insulating mounting surface forming a first portion of a side of said stack;
- a first integrated circuit die fastened to said first insulating mounting surface, said first integrated circuit die having a plurality of bonding pads on a bonding surface thereof, said bonding surface of said first integrated circuit die being substantially parallel to said first insulating mounting surface, said bonding pads providing connections for signals to and from said first integrated circuit die; and
- a first set of interconnection leads connected to said bonding pads and extending to said outer perimeter of said first insulating mounting surface;

a second layer comprising:
- a second insulating mounting surface having an outer perimeter, said second insulating mounting surface being substantially parallel to said first insulating mounting surface, at least a portion of said outer perimeter of said second insulating mounting surface forming a second portion of said side of said stack;
- a second integrated circuit die fastened to said second insulating mounting surface, said second integrated circuit die having a plurality of bonding pads on a bonding surface thereof, said bonding surface of said second integrated circuit die facing in the same direction as said bonding surface of said first integrated circuit die, said bonding pads providing connections for signals to and from said second integrated circuit die, and
- a second set of interconnection leads connected to said bonding pads and extending to said outer perimeter of said second insulating mounting surface; and plural connections on said side stack between said first and second sets of interconnection leads of said first and second layers, said plural connections being shorter than said interconnection leads of said first and second sets of interconnection leads.

* * * * *